(12) United States Patent
Maeda et al.

(10) Patent No.: US 12,117,498 B2
(45) Date of Patent: Oct. 15, 2024

(54) SYSTEM AND METHOD FOR PRESENTING ELECTRIC VEHICLE CHARGING OPTIONS BASED ON A PREDICTED CHARGING SPEED

(71) Applicant: Honda Motor Co., Ltd., Tokyo (JP)

(72) Inventors: Eri Izumi Maeda, Rancho Palos Verdes, CA (US); David Wong Cun, Fountain Valley, CA (US)

(73) Assignee: HONDA MOTOR CO., LTD., Tokyo (JP)

( * ) Notice: Subject to any disclaimer, the term of this patent is extended or adjusted under 35 U.S.C. 154(b) by 0 days.

(21) Appl. No.: 17/479,380

(22) Filed: Sep. 20, 2021

(65) Prior Publication Data

US 2022/0050143 A1 Feb. 17, 2022

Related U.S. Application Data

(63) Continuation-in-part of application No. 17/095,013, filed on Nov. 11, 2020, now abandoned, which is a
(Continued)

(51) Int. Cl.
*G01R 31/387* (2019.01)
*B60L 53/30* (2019.01)
(Continued)

(52) U.S. Cl.
CPC .......... *G01R 31/387* (2019.01); *B60L 53/305* (2019.02); *G01R 31/3648* (2013.01); *G01R 31/382* (2019.01); *G06Q 10/02* (2013.01)

(58) Field of Classification Search
CPC ..... B60L 53/305; G06Q 10/02; G01R 31/387; G01R 31/382; G01R 31/3648
See application file for complete search history.

(56) References Cited

U.S. PATENT DOCUMENTS 8,417,401 B2   4/2013   Takahara et al.
8,615,355 B2   12/2013  Inbarajan et al.
(Continued)

FOREIGN PATENT DOCUMENTS

CN   106573546 A   4/2017
CN   108001282     5/2018
(Continued)

OTHER PUBLICATIONS

S. Su, H. Zhao, H. Zhang, X. Lin, F. Yang and Z. Li, "Forecast of electric vehicle charging demand based on traffic flow model and optimal path planning," 2017 19th International Conference on Intelligent System Application to Power Systems (ISAP), San Antonio, TX, USA, 2017, p. 1-6, doi: 10.1109/ISAP (Year: 2017).*
(Continued)

*Primary Examiner* — Michael P Harrington
*Assistant Examiner* — Tayar M Kyu
(74) *Attorney, Agent, or Firm* — RANKIN, HILL & CLARK LLP

(57) ABSTRACT

A system and method for presenting electric vehicle charging options based on a predicted charging speed. According to one aspect, a method includes determining a current geo-location of an electric vehicle and determining a current state of charge of a battery. The method also includes identifying a plurality of charging stations that are within a remaining distance that the electric vehicle is capable of traveling based on the current geo-location of the electric vehicle and the current state of charge of the battery. The method further includes receiving one or more charge parameters. The method yet further includes calculating predicted charging speeds. The method includes calculating charging information. The method also includes presenting a charging station map user interface. The method further includes displaying the calculated charging information on
(Continued)

the charging station map user interface. The charging stations are presented with labels based on the charging information.

20 Claims, 11 Drawing Sheets

Related U.S. Application Data continuation-in-part of application No. 16/593,580, filed on Oct. 4, 2019.

(60) Provisional application No. 62/886,895, filed on Aug. 14, 2019.

(51) Int. Cl.
    *G01R 31/36*    (2020.01)
    *G01R 31/382*   (2019.01)
    *G06Q 10/02*    (2012.01)

(56) References Cited

U.S. PATENT DOCUMENTS

| | | |
|---|---|---|
| 8,717,170 B1 | 5/2014 | Juhasz |
| 8,963,494 B2 | 2/2015 | Kishiyama et al. |
| 8,965,669 B2 | 2/2015 | Fisher et al. |
| 9,056,553 B2 | 6/2015 | Cun |
| 9,112,382 B2 | 8/2015 | Paul et al. |
| 9,132,746 B2 | 9/2015 | Enomoto et al. |
| 9,142,978 B2 | 9/2015 | Juhasz |
| 9,177,306 B2 | 11/2015 | Penilla et al. |
| 9,379,559 B2 | 6/2016 | O'Connell et al. |
| 9,448,083 B2 | 9/2016 | Loftus et al. |
| 9,459,114 B2 | 10/2016 | Saito et al. |
| 9,545,853 B1 | 1/2017 | Penilla et al. |
| 9,580,079 B2 | 2/2017 | Long |
| 9,610,853 B1 | 4/2017 | Miller et al. |
| 9,685,798 B2 | 6/2017 | Appelbaum et al. |
| 9,709,988 B2 | 7/2017 | Miller et al. |
| 9,739,624 B2 | 8/2017 | Rajagopalan et al. |
| 9,744,871 B2 * | 8/2017 | Sabripour ............... B60L 53/67 |
| 9,796,280 B2 | 10/2017 | McCool et al. |
| 9,937,794 B2 | 4/2018 | Bellin et al. |
| 10,101,397 B2 | 10/2018 | Cooley et al. |
| 10,168,170 B2 | 1/2019 | North et al. |
| 10,185,978 B2 | 1/2019 | Khoo et al. |
| 10,369,974 B2 | 8/2019 | Carlson et al. |
| 2008/0243330 A1 | 10/2008 | Kato |
| 2010/0094496 A1 | 4/2010 | Hershkovitz et al. |
| 2011/0225105 A1 | 9/2011 | Scholer et al. |
| 2012/0019204 A1 | 1/2012 | Matsuo et al. |
| 2014/0021908 A1 * | 1/2014 | McCool ................ H02J 50/12 320/108 |
| 2014/0316939 A1 * | 10/2014 | Uyeki ..................... B60L 3/12 705/26.9 |
| 2015/0183333 A1 | 7/2015 | Forbes, Jr. et al. |
| 2015/0191097 A1 | 7/2015 | Jones et al. |
| 2015/0202975 A1 | 7/2015 | Solomon et al. |
| 2015/0294329 A1 * | 10/2015 | Saito ................... B60L 3/0046 705/7.31 |
| 2016/0264011 A1 | 9/2016 | Yasukawa et al. |
| 2016/0335377 A1 * | 11/2016 | Yamashina .......... G08G 1/0112 |
| 2017/0010116 A1 | 1/2017 | Inoue et al. |
| 2017/0030728 A1 | 2/2017 | Baglino et al. |
| 2017/0074671 A1 | 3/2017 | Yoshimura et al. |
| 2017/0120758 A1 | 5/2017 | Xu et al. |
| 2017/0168493 A1 | 6/2017 | Miller et al. |
| 2018/0060778 A1 | 3/2018 | Guo et al. |
| 2018/0073882 A1 * | 3/2018 | North ..................... B60L 53/60 |
| 2018/0158150 A1 | 6/2018 | Li et al. |
| 2018/0260887 A1 * | 9/2018 | Takatsuka ............ B60L 53/665 |
| 2018/0340784 A1 | 11/2018 | Upadhyay et al. |
| 2018/0370379 A1 | 12/2018 | Chen et al. |
| 2019/0025068 A1 | 1/2019 | Yoshino et al. |
| 2019/0143831 A1 | 5/2019 | Birek et al. |
| 2019/0152335 A1 | 5/2019 | Farber |
| 2019/0207398 A1 * | 7/2019 | Shih ...................... H02J 7/0071 |
| 2019/0285425 A1 | 9/2019 | Ludwick et al. |
| 2020/0126123 A1 | 4/2020 | Loriaux |
| 2020/0198658 A1 | 6/2020 | Suzuki et al. |
| 2020/0254896 A1 | 8/2020 | Lee et al. |
| 2020/0317084 A1 | 10/2020 | Schaffer et al. |
| 2020/0376972 A1 | 12/2020 | Martin et al. |
| 2021/0049907 A1 | 2/2021 | Dhillon et al. |
| 2021/0380012 A1 | 12/2021 | Tsuda et al. |

FOREIGN PATENT DOCUMENTS

| | | |
|---|---|---|
| CN | 108556661 | 9/2018 |
| CN | 109029477 | 12/2018 |
| CN | 106427635 | 3/2019 |
| CN | 109900288 | 6/2019 |
| CN | 109927566 | 6/2019 |
| CN | 109993342 A | 7/2019 |
| CN | 106447129 | 8/2019 |
| DE | 102010064015 | 6/2012 |
| DE | 102017006944 | 3/2018 |
| EP | 2676832 | 12/2013 |
| FR | 2971874 | 8/2012 |
| JP | 2010230615 | 10/2010 |
| JP | 2011170686 | 9/2011 |
| JP | 5408002 | 2/2014 |
| JP | 2014106137 | 6/2014 |
| JP | 2017116341 | 6/2017 |
| KR | 101845241 | 4/2018 |
| KR | 102046995 | 12/2019 |
| WO | WO2011104883 | 9/2011 |
| WO | WO2019126806 | 6/2019 |

OTHER PUBLICATIONS

Office Action of U.S. Appl. No. 16/654,348 dated May 6, 2022, 42 pages.
Notice of Allowance of U.S. Appl. No. 16/665,717 dated May 5, 2022, 39 pages.
Office Action of U.S. Appl. No. 17/095,013 dated May 13, 2022, 44 pages.
Office Action of U.S. Appl. No. 16/654,348 dated Jan. 6, 2022, 49 pages.
Office Action of U.S. Appl. No. 17/095,013 dated Aug. 12, 2022, 22 pages.
Office Action of U.S. Appl. No. 16/593,580 dated Mar. 29, 2022, 41 pages.
Office Action of U.S. Appl. No. 17/095,013 dated Jan. 28, 2022, 35 pages.
English Translation of JP2017096769A Title: Action Plan Planning and Execution Support Device Date: Jun. 1, 2017 Author: Onimaru HiroYuki (Year: 2017).
Office Action of U.S. Appl. No. 16/654,348 dated Nov. 22, 2022, 25 pages.
Office Action of U.S. Appl. No. 16/654,348 dated Sep. 6, 2022, 34 pages.
Office Action of U.S. Appl. No. 17/095,013 dated Feb. 17, 2023, 28 pages.
Office Action of U.S. Appl. No. 16/593,580 dated Dec. 22, 2022, 24 pages.
Office Action of U.S. Appl. No. 17/095,013 dated Dec. 9, 2022, 20 pages.
Office Action of U.S. Appl. No. 17/843,177 dated Dec. 22, 2022, 40 pages.
Notice of Allowance of U.S. Appl. No. 16/654,348 dated Apr. 13, 2023, 32 pages.
Office Action of U.S. Appl. No. 17/856,538 dated Mar. 27, 2023, 36 pages.
Office Action of U.S. Appl. No. 17/095,013 dated May 23, 2023, 25 pages.
Office Action of U.S. Appl. No. 16/593,580 dated May 26, 2023, 29 pages.

(56) References Cited

OTHER PUBLICATIONS

Office Action of U.S. Appl. No. 17/843,177 dated May 26, 2023, 32 pages.
Woodie, Machine Learning, Deep Learning, and AI: What's the Difference? May 10, 2017, datanami, https://www.datanami.com/2017/05/10/machine-learning-deep-learning-ai-whats-difference/ (Year: 2017).
Office Action of U.S. Appl. No. 17/856,538 dated Aug. 21, 2023, 18 pages.
Office Action of U.S. Appl. No. 16/593,580 dated Sep. 28, 2023, 23 pages.
Office Action of U.S. Appl. No. 17/095,013 dated Aug. 31, 2023, 28 pages.
Office Action of U.S. Appl. No. 17/843,177 dated Sep. 28, 2023, 23 pages.
Notice of Allowance of U.S. Appl. No. 17/856,538 dated Oct. 11, 2023, 11 pages.
Office Action of U.S. Appl. No. 17/843,177 dated Mar. 1, 2024, 25 pages.
Notice of Allowance of U.S. Appl. No. 16/593,580 dated Feb. 21, 2024, 25 pages.

\* cited by examiner

SYSTEM AND METHOD FOR PRESENTING ELECTRIC VEHICLE CHARGING OPTIONS BASED ON A PREDICTED CHARGING SPEED

CROSS-REFERENCE TO RELATED APPLICATION

This application is a continuation in part of U.S. Non-Provisional application Ser. No. 17/095,013 filed on Nov. 11, 2020, which claims priority to U.S. Provisional Application Ser. No. 62/886,895 filed on Aug. 14, 2019 and U.S. Non-Provisional application Ser. No. 16/593,580 filed on Oct. 4, 2019, all of which are expressly incorporated herein by reference.

BACKGROUND

Electric vehicles contain electric storage mechanisms (e.g., electric engines powered by rechargeable batteries) to store electricity and power the electric vehicles. The electric storage mechanisms may be replenished periodically by using, for example, charging equipment installed at a residential home or charging equipment installed at public or private charging stations. Operators of electric vehicles may be typically concerned about balancing charging efficiency and costs. In many cases, when operators connect their electric vehicles to charge, the electric vehicles may charge to a maximum state of charge at one or more charging speeds (e.g., 100% state of charge of the rechargeable batteries) regardless of the cost of energy during the charging session.

In many cases, operators may not be aware of additional or alternate locations at which charging may be completed at cheaper rates. In other cases, operators may arrive at a station and may not be able to charge their electric vehicle based on a backlog of additional customers that are charging their respective electric vehicles or are waiting in a queue to charge their respective electric vehicles. Additionally, operators may not be able to take advantage of cost savings with respect to charging stations, charge times, and/or additional charging resources that may be available to them and that may be utilized to balance electric vehicle charging efficiency and costs.

BRIEF DESCRIPTION

According to one aspect, a computer-implemented method for presenting electric vehicle charging options based on a predicted charging speed that includes determining a current geo-location of an electric vehicle and determining a current state of charge of a battery of the electric vehicle. The computer-implemented method also includes identifying a plurality of charging stations that are within a remaining distance that the electric vehicle is capable of traveling based on the current geo-location of the electric vehicle and the current state of charge of the battery of the electric vehicle. The computer-implemented method further includes receiving one or more charge parameters associated with the plurality of charging stations. The computer-implemented method yet further includes calculating predicted charging speeds for the plurality of charging stations based on the one or more of the charge parameters. The computer-implemented method includes calculating charging information based on the predicted charging speeds for the plurality of charging stations. The computer-implemented method also includes presenting a charging station map user interface that pin points the current geo-location of the electric vehicle and the charging stations of the plurality of charging stations. The computer-implemented method further includes displaying the calculated charging information on the charging station map user interface. The one or more of the charging stations are presented with labels based on the charging information.

According to another aspect, a system for presenting electric vehicle charging options based on a predicted charging speed that includes a memory storing instructions when executed by a processor cause the processor to determine a current geo-location of an electric vehicle and determine a current state of charge of a battery of the electric vehicle. The instructions also cause the processor to determine a plurality of charging stations that are within a remaining distance that the electric vehicle is capable of traveling based on the current geo-location of the electric vehicle and the current state of charge of the battery of the electric vehicle. The instructions also cause the processor to receive one or more charge parameters associated with the plurality of charging stations. The instructions further cause the processor to calculate predicted charging speeds for the plurality of charging stations based on the one or more of the charge parameters. The instructions yet further cause the processor to calculate charging information based on the predicted charging speeds for the plurality of charging stations. The instructions cause the processor to present a charging station map user interface that pin points the current geo-location of the electric vehicle and the charging stations of the plurality of charging stations. The instructions also cause the processor to display the calculated charging information on the charging station map user interface. The one or more of the charging stations are presented with labels based on the charging information.

According to still another aspect, a non-transitory computer readable storage medium storing instructions that when executed by a computer, which includes a processor perform a method, the method includes determining a current geo-location of an electric vehicle and determining a current state of charge of a battery of the electric vehicle. The method also includes determining that a plurality of charging stations are within a remaining distance that the electric vehicle is capable of traveling based on the current geo-location of the electric vehicle and the current state of charge of the battery of the electric vehicle. The method further includes receiving one or more charge parameters associated with the plurality of charging stations. The method yet further includes calculating predicted charging speeds for the plurality of charging stations based on the one or more of the charge parameters. The method includes calculating charging information based on the predicted charging speeds for the plurality of charging stations. The method also includes presenting a charging station map user interface that pin points the current geo-location of the electric vehicle and the charging stations of the plurality of charging stations. The method further includes displaying the calculated charging information on the charging station map user interface. The one or more of the charging stations are presented with labels based on the charging information.

BRIEF DESCRIPTION OF THE DRAWINGS

The novel features believed to be characteristic of the disclosure are set forth in the appended claims. In the descriptions that follow, like parts are marked throughout the specification and drawings with the same numerals, respectively. The drawing figures are not necessarily drawn to scale and certain figures can be shown in exaggerated or generalized form in the interest of clarity and conciseness. The disclosure itself, however, as well as a preferred mode of use, further objects and advances thereof, will be best understood by reference to the following detailed description of illustrative embodiments when read in conjunction with the accompanying drawings, wherein:

DETAILED DESCRIPTION

Figure 1:
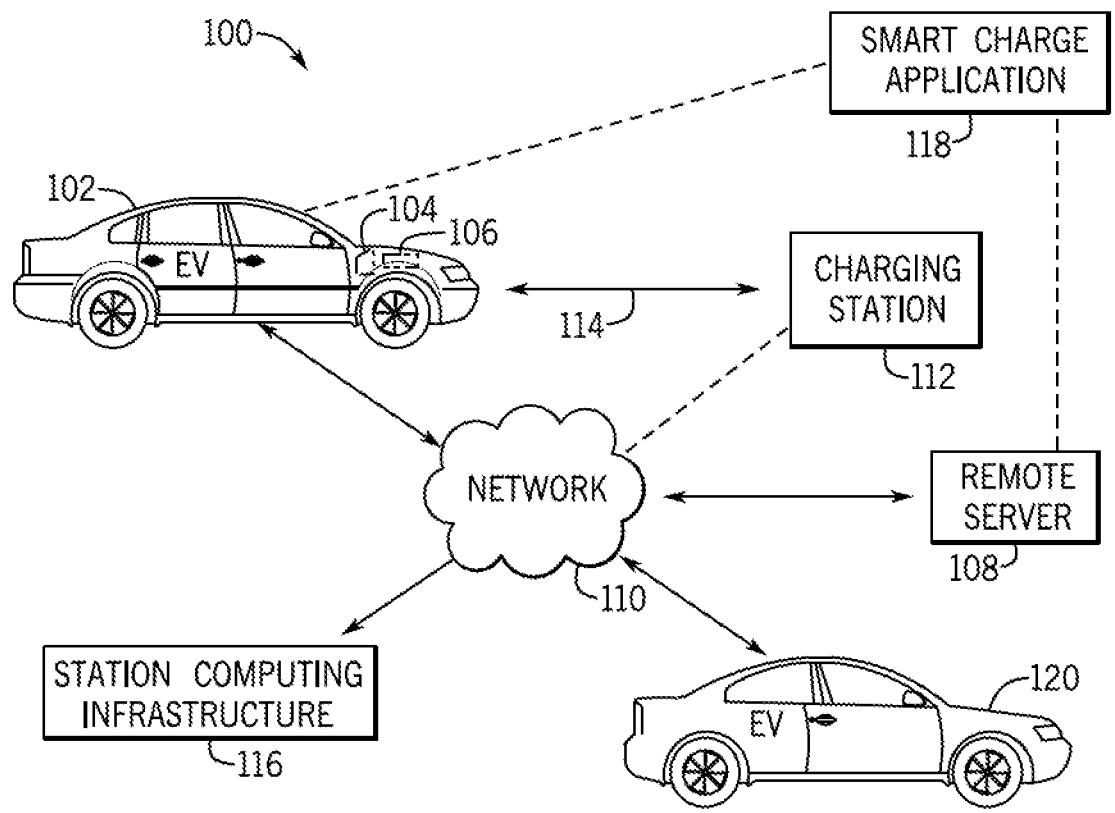
FIG. 1 is a high-level schematic view of an illustrative system for providing enhanced electric vehicle charging according to an exemplary embodiment of the present disclosure.

The following includes definitions of selected terms employed herein. The definitions include various examples and/or forms of components that fall within the scope of a term and that may be used for implementation. The examples are not intended to be limiting.

A "bus", as used herein, refers to an interconnected architecture that is operably connected to other computer components inside a computer or between computers. The bus may transfer data between the computer components. The bus may be a memory bus, a memory controller, a peripheral bus, an external bus, a crossbar switch, and/or a local bus, among others. The bus may also be a vehicle bus that interconnects components inside a vehicle using protocols such as Controller Area network (CAN), Local Interconnect Network (LIN), among others.

"Computer communication", as used herein, refers to a communication between two or more computing devices (e.g., computer, personal digital assistant, cellular telephone, network device) and may be, for example, a network transfer, a file transfer, an applet transfer, an email, a hypertext transfer protocol (HTTP) transfer, and so on. A computer communication may occur across, for example, a wireless system (e.g., IEEE 802.11), an Ethernet system (e.g., IEEE 802.3), a token ring system (e.g., IEEE 802.5), a local area network (LAN), a wide area network (WAN), a point-to-point system, a circuit switching system, a packet switching system, among others.

A "computer-readable medium", as used herein, refers to a medium that provides signals, instructions and/or data. A computer-readable medium may take forms, including, but not limited to, non-volatile media and volatile media. Non-volatile media may include, for example, optical or magnetic disks, and so on. Volatile media may include, for example, semiconductor memories, dynamic memory, and so on. Common forms of a computer-readable medium include, but are not limited to, a floppy disk, a flexible disk, a hard disk, a magnetic tape, other magnetic medium, other optical medium, a RAM (random access memory), a ROM (read only memory), and other media from which a computer, a processor or other electronic device may read.

A "data store", as used herein can be, for example, a magnetic disk drive, a solid state disk drive, a floppy disk drive, a tape drive, a Zip drive, a flash memory card, and/or a memory stick. Furthermore, the disk can be a CD-ROM (compact disk ROM), a CD recordable drive (CD-R drive), a CD rewritable drive (CD-RW drive), and/or a digital video ROM drive (DVD ROM). The disk can store an operating system that controls or allocates resources of a computing device. The data store can also refer to a database, for example, a table, a set of tables, a set of data stores (e.g., a disk, a memory, a table, a file, a list, a queue, a heap, a register) and methods for accessing and/or manipulating those data in those tables and data stores. The data store can reside in one logical and/or physical entity and/or may be distributed between two or more logical and/or physical entities.

A "memory", as used herein can include volatile memory and/or non-volatile memory. Non-volatile memory can include, for example, ROM (read only memory), PROM (programmable read only memory), EPROM (erasable PROM), and EEPROM (electrically erasable PROM). Volatile memory can include, for example, RAM (random access memory), synchronous RAM (SRAM), dynamic RAM (DRAM), synchronous DRAM (SDRAM), double data rate SDRAM (DDR SDRAM), and direct RAM bus RAM (DR-RAM). The memory can store an operating system that controls or allocates resources of a computing device.

An "operable connection", or a connection by which entities are "operably connected", is one in which signals, physical communications, and/or logical communications can be sent and/or received. An operable connection can include a physical interface, a data interface and/or an electrical interface.

A "processor", as used herein, processes signals and performs general computing and arithmetic functions. Signals processed by the processor can include digital signals, data signals, computer instructions, processor instructions, messages, a bit, a bit stream, or other means that may be received, transmitted and/or detected. Generally, the processor may be a variety of various processors including multiple single and multicore processors and co-processors and other multiple single and multicore processor and co-processor architectures. The processor may include various modules to execute various functions.

A "portable device", as used herein, is a computing device typically having a display screen with user input (e.g., touch, keyboard) and a processor for computing. Portable devices include, but are not limited to, key fobs, handheld devices, mobile devices, smart phones, laptops, tablets and e-readers.

An "electric vehicle" (EV), as used herein, refers to any moving vehicle that is capable of carrying one or more human occupants and is powered entirely or partially by one or more electric motors powered by an electric battery. The EV may include battery electric vehicles (BEVs), plug-in hybrid electric vehicles (PHEVs) and extended range electric vehicles (EREVs). The term "vehicle" includes, but is not limited to: cars, trucks, vans, minivans, SUVs, motorcycles, scooters, boats, personal watercraft, and aircraft.

A "value" and "level", as used herein may include, but is not limited to, a numerical or other kind of value or level such as a percentage, a non-numerical value, a discrete state, a discrete value, a continuous value, among others. The term "value of X" or "level of X" as used throughout this detailed description and in the claims refers to any numerical or other kind of value for distinguishing between two or more states of X. For example, in some cases, the value or level of X may be given as a percentage between 0% and 100%. In other cases, the value or level of X could be a value in the range between 1 and 10. In still other cases, the value or level of X may not be a numerical value, but could be associated with a given discrete state, such as "not X", "slightly x", "x", "very x" and "extremely x".

I. System Overview

Referring now to the drawings, wherein the showings are for purposes of illustrating one or more exemplary embodiments and not for purposes of limiting same, FIG. 1 is a high-level schematic view of an illustrative system 100 for presenting electric vehicle charging options according to an exemplary embodiment of the present disclosure. The components of the system 100, as well as the components of other systems and architectures discussed herein, may be combined, omitted or organized into different architectures for various embodiments.

In the exemplary embodiment of FIG. 1, the system 100 includes an electric vehicle (EV) 102 powered by an electric motor 104 and an electric storage mechanism, for example, a battery 106. In one embodiment, the EV 102 is purely electric in that it only has the electric motor 104. In other embodiments, the EV 102 may have the electric motor 104 and an internal combustion engine (not shown). In some embodiments, the EV 102 may have any number of electric motors, batteries, and/or internal combustion engines and they may operate in series (e.g., as in an extended range electric vehicle), in parallel, or some combination of series and parallel operation.

The EV 102 may be operably connected for computer communication to a remote server 108 via a wireless communication network 110. The EV 102 may transmit and receive data (e.g., state of charge data, energy cost data, charging commands/signals) to and from the remote server 108, and vice versa, through the network 110. The remote server 108 may be a remote computing system or a device remote (e.g., off-board) from the EV 102. The system architectures of the EV 102 and the remote server 108 will be discussed in more detail herein with reference to FIG. 2 and FIG. 3.

In the exemplary embodiment of FIG. 1, the system 100 may include one or more charging stations 112 that may connect to the EV 102 via a (respective) charging link 114. The charging station(s) 112 may include charging equipment (not shown) that may replenish the battery 106 of the EV 102 with charging power. Additionally, in some embodiments, the charging station(s) 112 may be operably connected for computer communication with the EV 102 and/or the remote server 108, for example, to transmit and receive data (e.g., charge parameters, charging data and feedback, vehicle system data) to and from the EV 102 and/or the remote server 108. The charging link 114 may be a wired or wireless link to the charging station(s) 112. Computer communication may occur also via the charging link 114 and/or a wired or wireless communication link. In one embodiment, the EV 102, the charging station(s) 112 and/or the charging link 114 may be operably controlled to initiate or terminate charging of the EV 102 from the charging station(s) 112 based on one or more charging schedules that are implemented within the system 100.

In one or more embodiments, the charging station(s) 112 may include charging equipment that may be installed at a residential home or outside a residential home, for example, at a public (e.g., non-networked) or private (e.g., networked) charging station(s). The charging station(s) 112 may include a charging station identification designation (e.g., identification number, serial number, alpha-numeric code, station name) that may be used to identify particular charging stations 112. The charging station(s) 112 may replenish the battery 106 using a charging energy source type that indicates the type of energy the charging station(s) 112 provides. Energy may include clean renewable energy and non-renewable energy. Clean renewable energy may include, solar energy, hydro energy, biomass energy, wind energy, among others. Non-renewable energy may include electricity from a grid source, and in the case of hybrid vehicles, fossil fuels.

In one or more embodiments, the EV 102 may be configured to output charging power to one or more additional electric vehicles 120 that may be physically linked via a vehicle to vehicle charging link (e.g., physical wired link, wireless link) (not shown) with the EV 102. The EV 102 may also be configured to receive charging power to charge the battery 106 of the EV 102 from one or more additional electric vehicles 120 that may be linked via the vehicle to vehicle charging link with the EV 102. Accordingly, the EV 102 and/or the one or more additional electric vehicles 120 may be configured to complete vehicle to vehicle wireless and/or wireline charging that may be completed in real-time without a current utilization of the charging station(s) 112.

In one or more configurations, the EV 102 may be configured of being capable of being fast charged based on fast charging components (not shown) that may be operably connected to the battery 106 and/or that may be included as part of the battery 106. Fast charging may enable the EV 102 to be charged at a faster charging speed (e.g., than a default charging speed) when being charged by a fast charging electric charging equipment (not shown) that may be included at the charging station(s) 112. In particular, fast charging may provide a higher charging voltage from a default/conventional charging voltage (e.g., increase from 240 volts to 480 volts) to more quickly charge the battery 106 of the EV 102. Accordingly, during utilization of fast charging the battery 106 of the EV 102 may be more quickly charged to a particular state of charge level than during the utilization of a conventional electric vehicle charging speed. The charging station(s) 112 may thereby provide a particular charging rate structure that may pertain to the utilization of the conventional electric vehicle charging speed. Additionally, the charging station(s) 112 may provide a particular charging rate structure that may pertain to the utilization of the fast electric vehicle charging speed.

In an exemplary embodiment, the EV 102, the charging station(s) 112, the additional electric vehicles 120, and/or the remote server 108 may receive and transmit data through the network 110 to a charging station computing infrastructure 116 (station computing infrastructure). The station computing infrastructure 116 may include one or more computing devices (not shown) that may communicate with one or more charging station business entities (e.g., charging station corporate owner) that may include utility providers, fuel providers, and/or entities that own and/or operate one or more various types of charging stations, fuel stations, energy stations, and the like.

In one embodiment, the station computing infrastructure 116 may receive perspective and/or real-time price data that may be provided by each respective charging station(s) 112 to communicate different charging rates. The perspective and/or real-time price data may include charging rates during a certain period of time (e.g., hourly, daily, weekly), charging rates to charge the EV 102 at various charging speeds (e.g., conventional electric vehicle charging speed, fast electric vehicle charging speed, charging power levels), charging rates that may be based on a customer rating that may be applied to an operator of the EV 102, and/or charging rates that may be applied to an operator of the EV 102 based on one or more incentives, discounts, and/or credits that may be provided.

In some embodiments, the station computing infrastructure 116 may determine a price per kilowatt-hour of energy (price per kWh) that may be communicated to the EV 102, the remote server 108, and/or the charging station(s) 112 based on utility rates that are received from the one or more energy providers. The price per kWh may include a dynamic value that may change over time based on a time of day, a season, a region, a time zone, etc. For example, each hour of a particular day may include a different price per kWh based on one or more pricing schemes that are implemented by the one or more energy providers.

In an exemplary embodiment, the system 100 may include a smart charge application 118 that may provide various types of enhancements that may be applicable to the charging of the EV 102 and additional electric vehicles. In an exemplary embodiment, the smart charge application 118 may be executed by the EV 102 (e.g., a processor, an electronic control unit) and/or the remote server 108 (e.g., a processor). The smart charge application 118 may include various modules and/or logic (not shown) to provide enhancements to the electric vehicle charging systems from the perspective of the operator of the EV 102, as discussed below.

In particular, the smart charge application 118 may be configured to provide one or more user interfaces to the operator of the EV 102 (and operators of additional electric vehicles 120) that may allow the operator to visually compare charging rates, charging infrastructure, charging queues, and/or additional charging related information that may pertain to various charging stations 112 that may be located within a particular vicinity of a real-time geo-location(s) of the EV 102, a perspective (e.g., predicted) geo-location(s) of the EV 102, and/or a dynamically based determined geo-location(s) that may be based on one or more factors associated with the EV 102.

Figure 2:
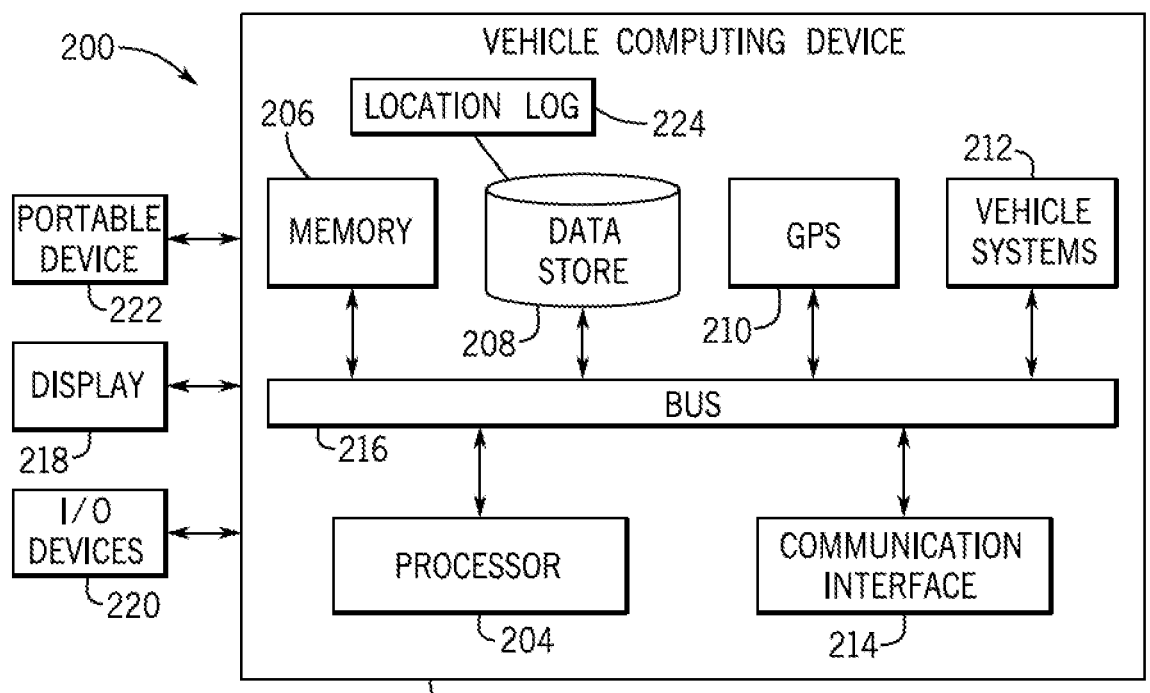
FIG. 2 is a schematic view of an illustrative electric vehicle architecture according to an exemplary embodiment of the present disclosure.

Referring now to FIG. 2, a schematic view of an illustrative electric vehicle architecture 200, for example the EV 102 of FIG. 1, is shown according to an exemplary embodiment. In particular, the EV 102 may include a vehicle computing device 202 (e.g., a telematics unit, an electronic control unit) with provisions for processing, communicating and interacting with various components of the EV 102 and other components of the system 100. The vehicle computing device 202 may include a processor 204, a memory 206, a data store 208, a position determination device 210 (GPS), a plurality of vehicle systems 212 (e.g., including the electric motor 104, the battery 106) and a communication interface 214. The components of the architecture 200, including the vehicle computing device 202, may be operably connected for computer communication via a bus 216 (e.g., a Controller Area Network (CAN) or a Local Interconnect Network (LIN) protocol bus) and/or other wired and wireless technologies. The vehicle computing device 202 as well as the EV 102 may include other components and systems not shown.

The data store 208 may store application data that may also include data pertaining to the smart charge application 118. In one embodiment, the data store 208 of the EV 102 may include a location log 224 that may optionally (e.g., based on user approval) keep a log of locations at which the EV 102 is driven, parked, and/or charged. The location log 224 may be analyzed by the smart charge application 118 in comparison to point of interest data that may be provided by the station computing infrastructure 116 and stored on the data store 208 of the EV 102 (e.g., pre-stored by the OEM) and/or stored on the data store 308 of the remote server 108 (e.g., pre-stored by a charging station entity). Upon analyzing the location log 224, the smart charge application 118 may be configured to determine one or more travel routines that may be followed by the operator of the EV 102.

The communication interface 214 of the EV 102 may provide software, firmware and/or hardware to facilitate data input and output between the components of the vehicle computing device 202 and other components, networks and data sources. Further, the communication interface 214 may facilitate communication with a display 218 (e.g., head unit display, head up display, dash board display) in the EV 102 and other input/output devices 220, for example, a portable device 222 (e.g., key fob, smart phone) connected to the EV 102.

In some embodiments the portable device 222 may include some or all of the components and functionality of the vehicle computing device 202. Additionally, the communication interface 214 may facilitate communication between the EV 102 and the portable device 222 that may include a display and/or input/output devices (not shown) be used to operate various functions of the EV 102. In one embodiment, the display 218 of the EV 102 and/or the portable device 222 (e.g., through a display screen of the portable device 222) may be utilized to provide one or more user interfaces that may be included as a human machine interface(s) of the smart charge application 118.

Figure 3:
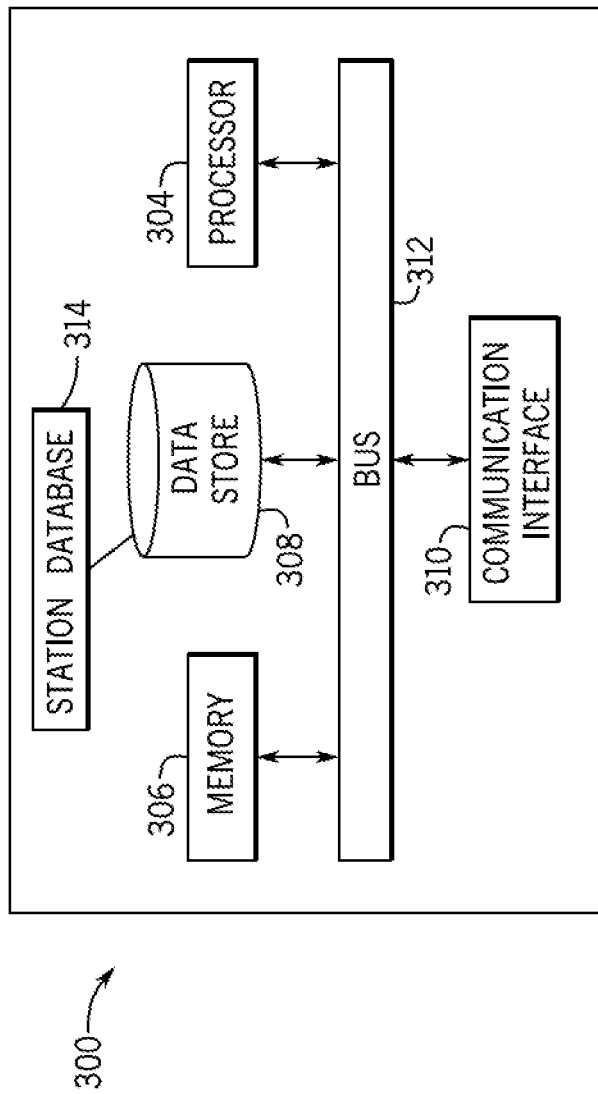
FIG. 3 is a schematic view of an illustrative remote server architecture according to an exemplary embodiment of the present disclosure.

Referring now to FIG. 3, a schematic view of an illustrative remote server architecture 300, for example the remote server 108 of FIG. 1, is shown according to an exemplary embodiment. The remote server 108, is located remotely (i.e., off-board) from the EV 102 (as shown in FIG. 1). In some embodiments, the remote server 108 may be maintained by a charging station entity, an Original Equipment Manufacturer (OEM) (e.g., of the EV 102), a utility provider, a regulatory body, among others. In additional embodiments, the remote server 108 may be another type of remote device or supported by a cloud architecture. In FIG. 3, the remote server 108 may include a computing device 302 that may further include a processor 304, a memory 306, a data store 308 and a communication interface 310. The components of the architecture 300, including the computing device 302, may be operably connected for computer communication via a bus 312 and/or other wired and wireless technologies. The computing device 302 as well as the remote server 108 may include other components and systems not shown.

The data store 308 may store application data that may also include data pertaining to the smart charge application 118. In one configuration, the data store 308 may include a customer dataset (not shown) that may include data pertaining to operators of electric vehicles (including the operator of the EV 102) that may utilize the charging station(s) 112. In one configuration, the customer dataset may include a charging schedule that may be associated with the EV 102 utilized by the operator. As discussed below, the smart charge application 118 may allow the operator and/or the charging station entity to update the charging schedule associated with the EV 102 and/or additional electric vehicles 120 that may utilize one or more charging stations 112. Additionally, the customer dataset may include a subjective customer rating (e.g., 1-10 value) that may be applicable to the operators of electric vehicles as determined by the smart charge application 118 and/or one or more charging station entities that may be provided based on one or more factors.

In one configuration, the data store 308 of the remote server 108 may include a station database 314 that may include respective records of charging stations 112 that may be owned and/or operated by one or more charging station entities. The station database 314 may include records that each pertain to particular charging stations 112 that include data that may be pre-updated and/or updated in real-time by one or more charging station entities. In one configuration, the station database 314 may include records that may pertain to particular charging stations 112 and their respective geo-locations (GPS/DGPS coordinates of the charging station(s) 112).

The station database 314 may also include records that may pertain to one or more particular charging stations 112 and one or more pricing schemes that may be implemented by the respective charging stations 112. The one or more pricing schemes may include a price per kWh that may include a dynamic value that may change over time based on a time of day, a season, a region, a time zone, charging power requirements, a charging speed, charging queue place, customer incentives, etc. For example, each hour of a particular day may include a different price per kWh based on one or more pricing schemes that are implemented by the one or more energy providers. Additionally, the one or more pricing schemes may include price per kWh that may be influenced based on a customer rating associated with a respective operator and/or additional factors including, but not limited to, purchase of goods and/or services from the charging station entity and/or additional retailers/service providers. In some embodiments, the station database 314 may also include records that pertain to particular charging stations 112 and current utilization of the charging stations 112. The current utilization of the charging stations 112 may pertain to wait times that may be applicable with respect to the charging of the EV 102.

In one configuration, the communication interface 310 may provide software, firmware and/or hardware to facilitate data input and output between the components of the computing device 302 and other components, networks and data sources. In some embodiments, the communication interface 310 may be used to communicate with the EV 102, the charging station(s) 112, the portable device 222, additional electric vehicles 120, and/or other components of system 100 and architecture 200.

II. The Smart Charge Application and Related Methods

The smart charge application 118 and its components will now be discussed in more detail according to an exemplary embodiment and with continued reference to FIGS. 1-3. In one or more embodiments, the smart charge application 118 may be executed by the vehicle computing device 202 of the EV 102 and/or the computing device 302 of the remote server 108. In an alternate embodiment, the smart charge application 118 may be executed by a processor (not shown) of the portable device 222 that may be used by the operator of the EV 102.

In one or more configurations, data may be sent or received from the smart charge application 118 to the components of the EV 102, the remote server 108, the charging station(s) 112, the charging link 114, the portable device 222, and/or the additional electric vehicles 120. For example, commands from the smart charge application 118 may be sent to the charging station(s) 112 and/or the charging link 114 to initiate or terminate charging of the EV 102 during one or more periods of time based on the one or more factors and/or the one or more charging schedules.

In an exemplary embodiment, the smart charge application 118 may include one or more user input interfaces and/or input means (e.g., buttons) that may be presented via the display 218, presented via the portable device 222, and or included within the EV 102 and/or on the portable device 222. In one embodiment, the one or more user input interfaces and/or input means may include user interface inputs that may be utilized by an individual (e.g., the operator of the EV 102) to enable or disable the presentation of one or more user interface graphics that may be presented by the smart charge application 118. Additionally, the one or more user input interfaces and/or input means may include user interface inputs that may be utilized by an individual to enable or disable one or more smart charging functions provided by the smart charge application 118.

As discussed above, the smart charge application 118 may be configured to provide one or more user interfaces to the operator of the EV 102 (and operators of additional electric vehicles) that may allow the operator to visually compare charging rates, charging infrastructure, charging queues, and/or additional charging related information that may pertain to various charging stations 112 that may be located within a particular vicinity of a current (e.g., real-time) geo-location of the EV 102, a perspective (e.g., predicted) geo-location(s) of the EV 102, and/or a dynamically based determined geo-location(s) that may be based on one or more factors associated with the EV 102.

Figure 4:
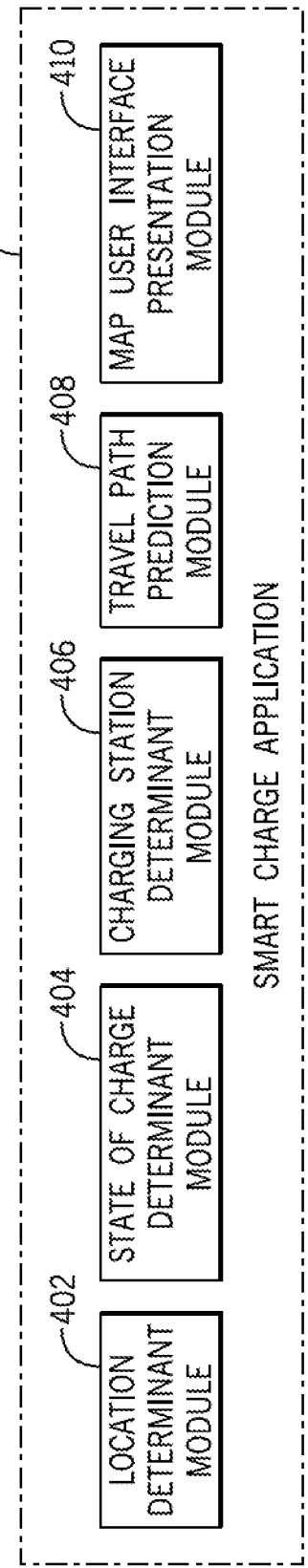
FIG. 4 is a schematic view of a plurality of modules of a smart charge application that may execute computer-implemented instructions for presenting electric vehicle charging options according to an exemplary embodiment of the present disclosure.

FIG. 4 is a schematic view of a plurality of modules 402-410 of the smart charge application 118 that may execute computer-implemented instructions for presenting electric vehicle charging options according to an exemplary embodiment of the present disclosure. In an exemplary embodiment, the plurality of modules 402-410 may include a location determinant module 402, a state of charge determinant module (SOC determinant module) 404, a charging station determinant module 406, a travel path prediction module 408, and a map user interface presentation module (map presentation module) 410. It is appreciated that the smart charge application 118 may include one or more additional modules and/or sub-modules that are included in lieu of the modules 402-410.

In one or more configurations, the location determinant module 402 of the smart charge application 118 may be configured to determine the current geo-location of the EV 102 (e.g., current GPS/DGPS coordinates of the EV 102). In particular, the location determinant module 402 may be configured to communicate with the GPS 210 of the EV 102 to determine the current geo-location of the EV 102 at one or more points in time. In some embodiments, the location determinant module 402 may be configured to store the one or more geo-locations of the EV 102 determined at one or more points in time within the data store 208 of the vehicle computing device 202 and/or the data store 308 of the remote server 108.

In an exemplary embodiment, the SOC determinant module 404 may be configured to determine a current state of charge (SOC) (e.g., charging level) of the battery 106 of the EV 102. In one configuration, the SOC determinant module 404 may be configured to communicate with the processor 204 of the vehicle computing device 202 to determine the current SOC of the battery 106 of the EV 102. In one embodiment, the processor 204 may be configured to communicate with a micro-processor (not shown) that may be included as part of electrical circuitry of the battery 106 to determine a current SOC of the battery 106.

In one or more embodiments, upon determining one or more geo-locations of the EV 102, the location determinant module 402 may be configured to communicate respective data to the charging station determinant module 406. In one embodiment, upon receiving data pertaining to a current geo-location of the EV 102, the charging station determinant module 406 may be configured to determine geo-locations of one or more charging stations 112 that may be located within a predetermined distance (e.g. 5 miles in one or more directions) of the current geo-location of the EV 102.

In particular, the charging station determinant module 406 may be configured to access the station database 314 stored upon the data store 308 of the remote server 108. As discussed, the station database 314 may include records that each pertain to particular charging stations 112 that include data that may be pre-updated and/or updated in real-time by one or more charging station entities. Such records may pertain to particular charging stations 112 and their respective geo-locations. Accordingly, the charging station determinant module 406 may be configured to access and query the station database 314 to determine one or more charging stations 112 that may be located within a predetermined distance (e.g., 5 miles) of the current geo-location of the EV 102 or within a predetermined distance of a type of amenity or selected point of interest location.

In another embodiment, the SOC determinant module 404 may be configured to determine the SOC of the battery 106 of the EV 102 at one or more points in time based on communication with the processor 204 of the vehicle computing device 202 of the EV 102. The SOC determinant module 404 may be additionally configured to analyze the current geo-location of the EV 102 and determine a remaining distance that the EV 102 is capable of traveling. The remaining distance may be determined based on analyzing the current SOC of the battery 106, an average speed of the EV 102, and/or one or more road types (e.g., local, highway, road grades) that may be located within a vicinity of the current geo-location of the EV 102. Upon determining the current SOC and remaining distance that the EV 102 may travel at the average speed of the EV 102, the SOC determinant module 404 may communicate respective data to the charging station determinant module 406.

In one embodiment, the charging station determinant module 406 may be configured to analyze the current geo-location of the EV 102 as determined and communicated by the location determinant module 402 in addition to the current SOC and remaining distance that the EV 102 may travel as determined and communicated by the SOC determinant module 404. The charging station determinant module 406 may thereby be configured to determine one or more charging stations 112 that may be located within a distance that the EV 102 may travel to reach based the charging station(s) on the current geo-location of the EV 102, the current SOC of the battery 106 of the EV 102, and/or one or more road types (e.g., local, highway, road grades) that may be located within a vicinity of the current geo-location of the EV 102.

In another embodiment, the charging station determinant module 406 may be configured to determine the location of additional electric vehicles 120 that may be configured to provide charging power to charge the battery 106 of the EV 102. As discussed above, the additional electric vehicles 120 may additionally or alternatively be configured to receive charging power from the EV 102. In particular, the charging station determinant module 406 may be configured to communicate with GPS devices (not shown) of the additional electric vehicles 120 to determine respective geo-locations of the additional electric vehicles 120.

In one configuration, upon determining the respective geo-locations of the additional electric vehicles 120 the charging station determinant module 406 may be configured to analyze the current geo-location of the EV 102 as determined based on communication received from the location determinant module 402. The charging station determinant module 406 may be configured to compare the current geo-location of the EV 102 to the respective geo-locations of the additional electric vehicles 120 to determine one or more additional electric vehicles 120 that may be located within a predetermined distance of the EV 102.

In another configuration, upon determining the respective geo-locations of the additional electric vehicles 120, the charging station determinant module 406 may be configured to analyze the current geo-location of the EV 102 and the current SOC of the battery 106 of the EV 102, as determined based on communication received from the SOC determinant module 404. The charging station determinant module 406 may be configured to compare the current geo-location of the EV 102 to the respective geo-locations of the additional electric vehicles 120. Additionally, the charging station determinant module 406 may analyze the remaining distance that the EV 102 may travel as determined and communicated by the SOC determinant module 404 to thereby determine one or more additional electric vehicles 120 that may be located within a distance that the EV 102 may travel to reach the charging station(s) 112 based on the current geo-location of the EV 102, the current SOC of the battery 106 of the EV 102, and/or one or more road types that may be located within a vicinity of the current geo-location of the EV 102. The charging station determinant module 406 may be configured to communicate data determined by the module 406 to the map presentation module 410 of the smart charge application 118.

In an exemplary embodiment, the travel path prediction module 408 of the smart charge application 118 may be configured to predict one or more perspective travel paths of the EV 102 based on the determination and analysis of one or more travel routines that may be followed by the operator of the EV 102. As discussed above, the location log 224 stored on the data store 208 of the vehicle computing device 202 may include a log of locations at which the EV 102 is driven, parked, and/or charged. In one configuration, the travel path prediction module 408 may analyze the location log 224 to determine one or more point of interest locations that may be frequently and/or routinely traveled to by the EV 102. In particular, the travel path prediction module 408 may analyze point of interest data (not shown) that may be stored on the data store 208 of the vehicle computing device 202 and/or the data store 308 of the remote server 108 to determine one or more points of interest locations that may be frequently and/or routinely traveled to by the EV 102.

Upon analyzing the location log 224, the travel path prediction module 408 may be configured to determine one or more travel routines that may be followed by the operator of the EV 102. In some configurations, the one or more travel routines may be analyzed through a neural network (not shown) to provide computer/machine based/deep learning techniques to determine whether a particular trip of the EV 102 is a routine trip or non-routine trip based on the analysis of data provided by the GPS 210.

In one embodiment, the travel path prediction module 408 may analyze the current geo-location of the EV 102 at one or more points in time with respect a particular timeframe of utilization of the EV 102 and one or more routine trips that may be determined to thereby predict one or more perspective travel routes that may be utilized by the EV 102 to reach one or more points of interest locations that may be frequently and/or routinely traveled to by the EV 102. The travel path prediction module 408 may thereby communicate data pertaining to the perspective travel routes to the charging station determinant module 406.

In one embodiment, upon receiving data pertaining to one or more perspective travel routes of the EV 102, the charging station determinant module 406 may be configured to access and query the station database 314 to determine one or more charging stations 112 that may be located within a predetermined distance of one or more perspective travel paths that are predicted to be utilized by the EV 102 based on one or more travel routines of the operator of the EV 102.

In one embodiment, the travel path prediction module 408 may be configured to communicate one or more perspective travel paths that are predicted to be utilized by the EV 102 to the SOC determinant module 404. The SOC determinant module 404 may be configured to analyze the current SOC of the battery 106 of the EV 102 and the one or more perspective travel paths to predict one or more perspective SOC levels of the battery 106 during perspective travel of the EV 102. The one or more perspective SOC levels of the battery 106 may be based on the current SOC of the battery 106, an average speed of the EV 102, and/or one or more road types (e.g., local, highway, road grades) of the one or more perspective travel paths of the EV 102 as predicted by the travel path prediction module 408. Upon determining the perspective SOC levels of the battery 106, the SOC determinant module 404 may communicate data pertaining to the one or more perspective travel paths of the EV 102 and the one or more associated perspective SOC levels of the battery 106 to the charging station determinant module 406.

In one configuration, the charging station determinant module 406 may be configured to analyze the one or more perspective travel paths of the EV 102 and the associated perspective SOC levels of the battery 106 of the EV 102. The charging station determinant module 406 may thereby access and query the station database 314 to determine one or more charging stations 112 that may be located within a distance that the EV 102 may travel to reach based on the one or more perspective travel paths of the EV 102 and the associated perspective SOC level(s) of the battery 106 of the EV 102. Accordingly, the charging station determinant module 406 may determine one or more charging stations 112 that may be located on or within a predetermined distance of one or more perspective travel paths of the EV 102 and that may be located within a distance that is reachable by the EV 102 based on associated perspective SOC levels of the battery 106. As discussed above, the charging station determinant module 406 may be configured to communicate data determined by the module 406 to the map presentation module 410 of the smart charge application 118.

In an exemplary embodiment, the map presentation module 410 of the smart charge application 118 may be configured to present one or more charging station map user interfaces that present data determined and/or predicted by the modules 402-408, as discussed above. In particular, the charging station map interface(s) may include a map that may pin point a current geo-location of the EV 102, a perspective geo-location of the EV 102 on one or more perspective travel paths of the EV 102, a type of amenity, and/or a selected point of interest.

Figure 5:
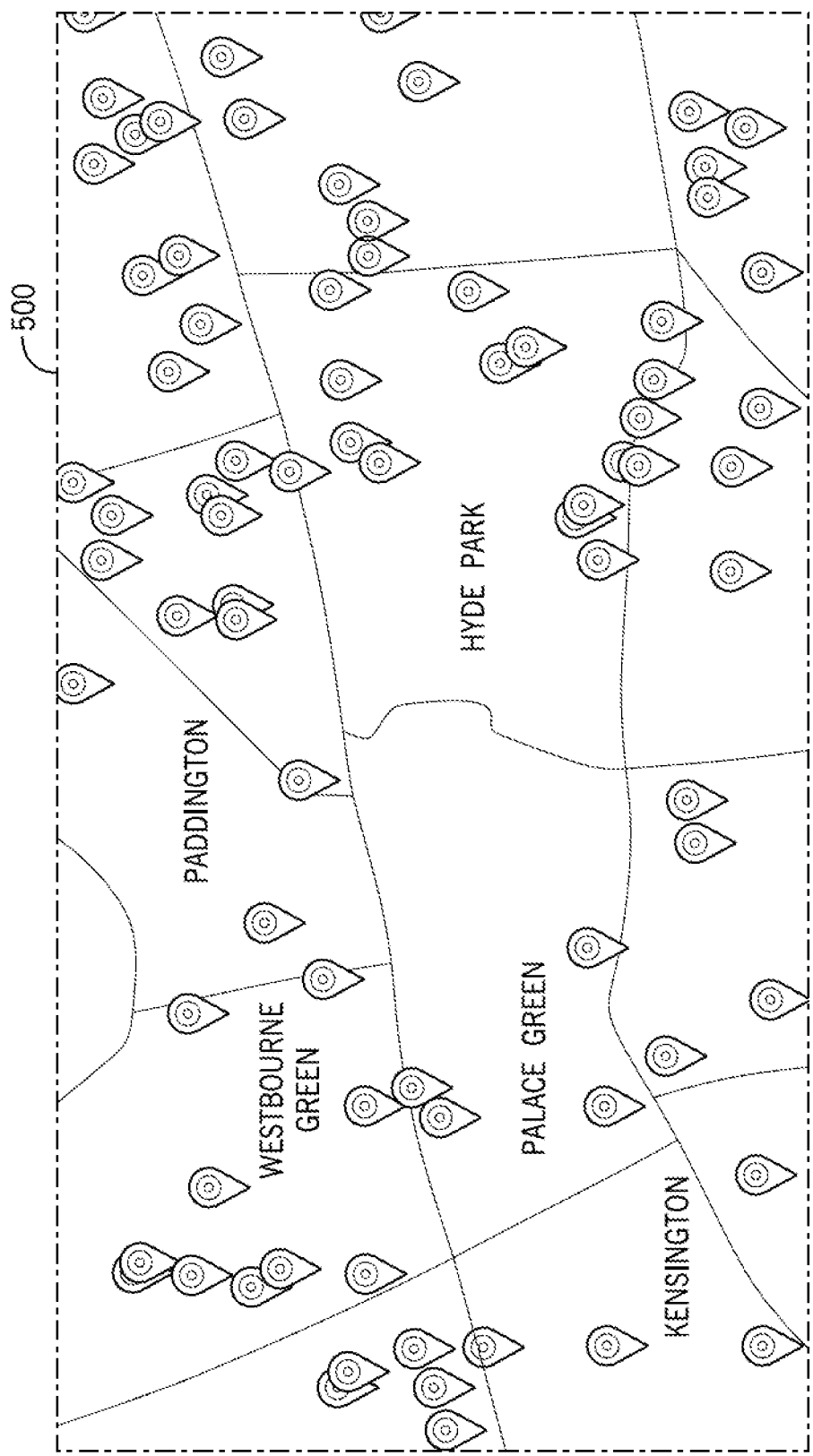
FIG. 5 is an illustrative example of a charging station map user interface according to an exemplary embodiment of the present disclosure.

As shown in FIG. 5, an illustrative example of a charging station map user interface 500 according to an exemplary embodiment of the present disclosure, the charging station map user interface 500 may be presented with pin points that are associated with respective charging stations 112. The charging station map user interface 500 may be presented through the display 218 of the EV 102 and/or a display of the portable device 222. As discussed below, the map presentation module 410 may present the charging station map user interface 500 to pin point a current geo-location of the EV 102, one or more perspective geo-locations of the EV 102, and the geo-location(s) of one or more charging stations 112 that may be located within the predetermined distance of the EV 102, within a predetermined distance of one or more perspective pathways of the EV 102, near one or more points of interest at which one or more routine activities may take place, and/or at one or more locations at which the EV 102 may need to be charged to maintain a sufficient SOC to be utilized complete one or more remaining routine activities and/or non-routine activities.

In some configurations, the charging station map user interface 500 may be presented in two-dimensional format (as shown in FIG. 5). In additional configurations, the charging station map user interface 500 may be converted to a three-dimensional format, a street-view format, a first person point of view format, a satellite view format, and the like based on the receipt of a respective user interface input.

The charging station map user interface 500 may be selectively enabled or disabled based on the receipt of a respective user interface input. In some configurations, the charging station map user interface 500 may be enabled based on a predetermined SOC level of the battery 106 of the EV 102 (e.g., 30% remaining SOC) and/or a user based enablement setting that may be associated with the geo-location of the EV 102 and/or a particular timeframe (e.g., particular day of the week). Upon enablement, the charging station map user interface 500 may be initially presented in a format that may show an area that may be included within a predetermined distance or user selected distance of the geo-location of the EV 102. The charging station map user interface 500 may be configured to be zoomed in or zoomed out to show a smaller area or larger area based on the adjustment of the distance of the geo-location of the EV 102 that is to be presented. Accordingly, the operator of the EV 102 may be able to view data associated with one or more charging stations 112 that may be located at a variable distance from the current geo-location of the EV 102 and/or one or more perspective travel paths of the EV 102.

In one embodiment, the operator may selectively input one or more charging stations 112 and/or charging station entities that own and/or operate particular charging stations 112 as favorites. Such favorites may be shown as highlighted or accompanied with a user interface graphic (e.g., star) that may allow the operator to easily identify them on the charging station map user interface 500. Additionally, the operator may selectively input one or more charging stations 112 and/or charging station entities that own and/or operate particular charging stations 112 as prohibited. Such prohibited charging stations 112 and/or charging stations 112 that are owned and/or operated by prohibited charging station entities may not be pin pointed on the charging station map user interface 500.

In additional embodiments, the operator may selectively input threshold preferences related to price schemes, queue/wait times, price incentives, charging types, and the like that may be utilized to pin point one or more charging stations 112 on the charging station map user interface 500. For example, the operator may choose a threshold queue/wait time threshold preference of "15 minutes" to highlight charging stations 112 that may include a 15 minute or less queue wait time. Accordingly, the charging station map user interface 500 may be selectively customized to pin point one or more charging stations 112 that may apply with respect to the threshold preferences. The one or more charging stations 112 may be shown as highlighted or accompanied with a user interface graphic (e.g., clock symbol) that may allow the operator to easily identify them on the charging station map user interface 500. In other embodiments, one or more charging stations 112 that may not apply with respect to the threshold preferences may be selectively hidden based on a user interface input received by the operator. It is to be appreciated that one or more charging stations 112 may be pin pointed, highlighted, accompanied with user interface graphics, and/or hidden based on user interface inputs that may be associated with various user preferences. The interface graphics may be based on a type of amenity available at or near a charging station. For example, a coffee cup icon may be illustrated near a charging station with hot beverages available.

Specific embodiments of the presentation of the map user interface(s) will now be described. With continued reference to FIG. 1, in one embodiment the map presentation module 410 may present the charging station map interface(s) as a map that may additionally pin point one or more charging stations 112 that may be determined to be within the (default) predetermined distance of the EV 102, as determined by the charging station determinant module 406. In another embodiment, the charging station map interface(s) may also or alternatively pin point one or more charging stations 112 that may be determined to be located within a distance that the EV 102 may travel to reach the charging station(s) 112 based on the current geo-location of the EV 102, the current SOC of the battery 106 of the EV 102, and/or one or more road types that may be located within a vicinity of the current geo-location of the EV 102.

In some embodiments, the charging station map interface(s) may pin point one or more charging stations 112 that may be located within a predetermined distance of one or more perspective travel paths that are predicted to be utilized by the EV 102 based on one or more travel routines of the operator of the EV 102, as determined by the charging station determinant module 406. In additional embodiments, the charging station map interface(s) may additionally or alternatively pin point one or more charging stations 112 that may be located on or near one or more perspective travel paths of the EV 102 as predicted by the travel path prediction module 408 and that may be located within a distance that is reachable by the EV 102 based on associated perspective SOC levels of the battery 106 as predicted by the SOC determinant module 404. In some embodiments, the charging station map interface(s) may pin point one or more charging stations 112 that may be located within a predetermined distance of one or more amenities.

In one embodiment, the map presentation module 410 may be configured to communicate with the station computing infrastructure 116 to determine one or more price schemes that may be implemented by respective charging stations 112 that are presented as pin pointed. The map presentation module 410 may be configured to present one or more price schemes and/or a summary of pricing that may be applicable to each of the respective charging stations 112 that are presented as pin pointed. The one or more charging stations 112 may be presented with an estimated cost to charge the EV 102 based on a current or perspective SOC of the EV 102 at one or more charging stations 112 based on respective price schemes. In some configurations, the map presentation module 410 may be configured to present one or more user interface input links that may be inputted by the operator of the EV 102 to determine additional pricing information and/or trends that may be applicable to the respective charging stations 112.

In another embodiment, the map presentation module 410 may be configured to communicate with the station computing infrastructure 116 to determine one or more queues/wait times (e.g., queues of electric vehicles to be charged) that are associated with respective charging stations 112. The one or more queues may be analyzed to determine respective wait times to charge the EV 102 if the EV 102 were to be added to a respective queue(s). Accordingly, the smart charge application 118 may present the charging station map user interface that includes a map that may pin point one or more charging stations 112 that include queue and wait time details that may pertain to each of the respective charging stations 112. In one configuration, the smart charge application 118 may present a user interface input that may be associated to each of the one or more charging stations 112 that may be selected by the operator to add or remove the EV 102 from a queue of a respective charging station(s) 112. Accordingly, the charging station map user interface(s) may be utilized by the operator to schedule the charging of the EV 102 at one or more charging stations(s) 112 at one or more points in time.

In some configurations, the map presentation module 410 may be configured to communicate with the station computing infrastructure 116 to determine one or more charging stations 112 that may be equipped to provide fast charging capabilities. The map presentation module 410 may be configured to present one or more of the charging stations 112 that may be equipped to provide fast charging capabilities as pin pointed on the charging station map user interface.

The charging station map user interface may be presented with respective user interface inputs that may be selected to add the EV 102 to a queue of one or more charging stations that may be configured to provide fast charging capabilities to fast charge the EV 102.

In one embodiment, the map presentation module 410 may be configured to communicate with the station computing infrastructure 116 to receive incentive pricing schemes that may be provided by one or more charging station entities and/or one or more particular charging stations 112. In another embodiment, the map presentation module 410 may communicate with remote server 108 to receive incentive pricing schemes that may be stored within the station database 314 that may include records that each pertain to particular charging stations 112 and/or charging station entities as populated by one or more charging station entities. In some circumstances, the incentive pricing schemes may be provided by one or more charging station entities to incentivize customers to charge their vehicles at one or more off-peak timeframes where a demand for charging may be below an average amount. For example, many customers may tend to charge electric vehicles during hours at night with in-home charging stations (not shown). Accordingly, the incentive pricing schemes provided may be provided by one or more charging station entities to incentivize customers to charge their vehicles at one or more off-peak timeframes at one or more charging stations 112 that may be owned and/or operated by the one or more charging station entities and that are available to the public.

In some embodiments, the incentive pricing schemes may be provided by one or more charging station entities to incentivize customers to charge their vehicles at one or more off-peak timeframes at one or more charging stations 112 that may be publicly accessible and that may be located within the predetermined distance of the EV 102, near one or more perspective pathways of the EV 102, near one or more points of interest at which one or more routine activities may take place, and/or at one or more locations at which the EV 102 may need to be charged to maintain a sufficient SOC to complete one or more remaining routine activities and/or non-routine activities.

In some configurations, the map presentation module 410 may also present the charging station map user interface that may include a map that may pin point a current geo-location of the EV 102, one or more perspective geo-locations of the EV 102, and the geo-location(s) of one or more charging stations 112 that may be located within the predetermined distance of the EV 102, near one or more perspective pathways of the EV 102, near one or more points of interest at which one or more routine activities may take place, and/or at one or more locations at which the EV 102 may need to be charged to maintain a sufficient SOC to complete one or more remaining routine activities. The one or more charging stations 112 may be presented with an estimated cost to charge the EV 102 based on a current or perspective SOC of the EV 102 at one or more charging stations 112 that implement the incentive pricing schemes. Accordingly, certain attributes pertaining to a time of day, pricing schemes, retail based discounts, credits, and/or offers may be presented to the operator through the charging station map user interface to provide details with respect to one or more charging stations 112 that may provide incentives to the operator.

In one or more embodiments, the map presentation module 410 may be configured to communicate with the charging station determinant module 406 to determine the geo-location(s) of one or more additional electric vehicles 120 that may be configured provide charging power to charge the battery 106 of the EV 102. As discussed above, the additional electric vehicles 120 may additionally or alternatively be configured to receive charging power from the EV 102.

As discussed above, upon determining the respective geo-locations of the additional electric vehicles 120 the charging station determinant module 406 may be configured to analyze the current geo-location of the EV 102 as determined based on communication received from the location determinant module 402. The charging station determinant module 406 may be configured to compare the current geo-location of the EV 102 to the respective geo-locations of the additional electric vehicles 120 to determine one or more additional electric vehicles 120 that may be located within a predetermined distance of the EV 102.

The map presentation module 410 may thereby receive respective data from the charging station determinant module 406 and may present the charging station map user interface(s) with the one or more pin points that pin point the current geo-locations of one or more additional electric vehicles 120 that may be located within a predetermined distance of the EV 102. The map presentation module 410 may present a user interface input that may be associated to each of the one or more additional electric vehicles 120 that may be selected by the operator to send and/or receive vehicle to vehicle communications with one or more additional electric vehicles 120 through the communication interface 214 of the vehicle computing device 202 to reserve vehicle to vehicle charging at one or more particular user interface selectable geo-locations that are presented on the charging station map user interface(s). In one embodiment, the interface selectable geo-locations may be displayed as reservation selection inputs that the EV operator can select to reserve the at least one charging station for charging the electric vehicle. Selecting one or more particular user interface selectable geo-locations that are presented on the charging station map user interface may allow the EV operator to reserve a time or position to charge. Accordingly, the charging station map user interface(s) may be utilized by the operator to reserve vehicle to vehicle charging of the EV 102 or from the EV 102 with one or more additional electric vehicles 120 at one or more points in time.

In some circumstances, the operator of the EV 102 and/or operators of respective additional electric vehicles 120 may set a charging rate to implement vehicle to vehicle charging through a vehicle charging rate user interface provided by the smart charge application 118. In other words, the operator(s) of the additional electric vehicle(s) 120 may set a charging rate to provide charging power to charge the EV 102 through vehicle to vehicle charging. Similarly, the operator of the EV 102 may set a charging rate to provide charging power to charge one or more additional electric vehicles 120 through vehicle to vehicle charging.

Upon the charging rates being set, the charging rate(s) may be stored upon the data store 308 of the remote server 108. In one embodiment, the map presentation module 410 may be configured to access the data store 308 to retrieve the charging rate associated with one or more respective additional electric vehicles 120 that may be located within a predetermined distance of the EV 102. The map presentation module 410 may thereby present the map user interface(s) with the one or more pin points that pin point the locations of one or more additional electric vehicles 120 that may be located within a predetermined distance of the EV 102 in addition to respective charging rates that may be charged by the respective additional electric vehicles 120.

It is to be appreciated that the map presentation module 410 may present the charging station map user interface(s) in a variety of formats that may be presented with graphics detailed within one or more of the aforementioned embodiments. Accordingly, the charging station map user interface (s) may be presented to provide various levels of information that may pertain to one or more charging stations 112 and/or additional electric vehicles 120 that may be potentially utilized to charge the EV 102 in or more manners. It is also to be appreciated that the map presentation module 410 may present the charging station map user interface(s) with additional contemplated information that may be related to utility costs, electric charging costs, a price per kWh of charging power that may include a dynamic value that may change over time based on a time of day, a season, a region, a time zone, etc., additional queue/wait time information, charging station/charging station entity incentives, and/or additional information that may be presented to the operator of the EV 102.

Figure 6:
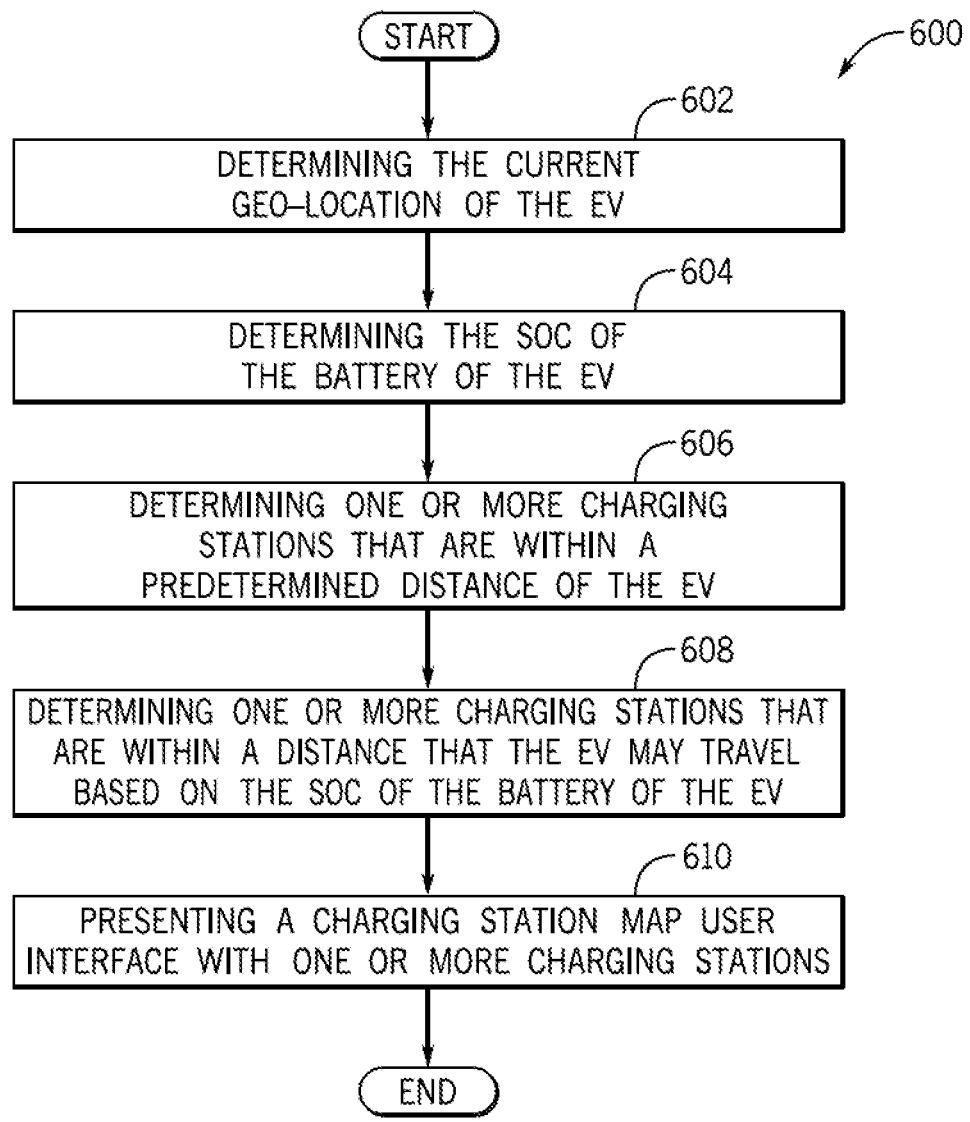
FIG. 6 is a process flow diagram of a method for presenting the charging station map user interface with one or more charging stations based on the current geo-location of an electric vehicle (EV) and the state of charge (SOC) of a battery of the EV according to an exemplary embodiment of the present disclosure.

FIG. 6 is a process flow diagram of a method 600 for presenting the charging station map user interface with one or more charging stations based on the current geo-location of the EV 102 and the SOC of the battery 106 of the EV 102 according to an exemplary embodiment of the present disclosure. FIG. 6 will be described with reference to the components of FIG. 1, FIG. 2, FIG. 3, and FIG. 4, through it is to be appreciated that the method 600 of FIG. 6 may be used with additional and/or alternative system components. The method 600 may begin at block 602, wherein the method 600 may include determining the current geo-location of the EV 102.

In an exemplary embodiment, the location determinant module 402 may be configured to communicate with the GPS 210 of the EV 102 to determine the current geo-location of the EV 102 at one or more points in time. In some embodiments, the location determinant module 402 may be configured to store one or more geo-locations of the EV 102 as determined at one or more points in time within the data store 208 of the vehicle computing device 202 and/or the data store 308 of the remote server 108.

The method 600 may proceed to block 604, wherein the method 600 may include determining the SOC of the battery 106 of the EV 102. As discussed above, the SOC determinant module 404 may be configured to determine the current SOC of the battery 106 of the EV 102. In one configuration, the SOC determinant module 404 may be configured to communicate with the processor 204 of the vehicle computing device 202 to determine the current SOC of the battery 106 of the EV 102. In one embodiment, the processor 204 may be configured to communicate with a microprocessor (not shown) that may be included as part of electrical circuitry of the battery 106 to determine a current SOC of the battery 106. The SOC determinant module 404 may be additionally configured to analyze the current geo-location of the EV 102 and determine a remaining distance that the EV 102 is capable of traveling. The remaining distance may be determined based on analyzing the current SOC of the battery 106, an average speed of the EV 102, and/or one or more road types (e.g., local, highway, road grades) that may be located within a vicinity of the current geo-location of the EV 102. Upon determining the current SOC and remaining distance that the EV 102 may travel at the average speed of the EV 102, the SOC determinant module 404 may communicate respective data to the charging station determinant module 406.

The method 600 may proceed to block 606 wherein the method 600 may include determining one or more charging stations 112 that are within a predetermined distance of the EV 102. In one embodiment, upon receiving data pertaining to a current geo-location of the EV 102, the charging station determinant module 406 may be configured to determine geo-locations of one or more charging stations 112 that may be located within the predetermined distance of the current geo-location of the EV 102. In particular, the charging station determinant module 406 may be configured to access and query the station database 314 to determine one or more charging stations 112 that may be located within the predetermined distance (e.g., 5 miles) of the current geo-location of the EV 102. Upon determining the one or more charging stations 112 that may be located within the predetermined distance of the current geo-location of the EV 102, the charging station determinant module 406 may communicate data pertaining to the one or more charging stations 112 to the map presentation module 410 of the smart charge application 118.

The method 600 may proceed to block 608 wherein the method 600 may include determining one or more charging stations 112 that are within a distance that the EV 102 may travel based on the SOC of the battery 106 of the EV 102. In one embodiment, the charging station determinant module 406 may be configured to analyze the current geo-location of the EV 102 as determined and communicated by the location determinant module 402 in addition to the current SOC and remaining distance that the EV 102 may travel as determined and communicated by the SOC determinant module 404. The charging station determinant module 406 may thereby be configured to access and query the station database 314 to determine one or more charging stations 112 that may be located within a distance that the EV 102 may travel to reach the charging station(s) 112 based on the current geo-location of the EV 102, the current SOC of the battery 106 of the EV 102, and/or one or more road types (e.g., local, highway, road grades) that may be located within a vicinity of the current geo-location of the EV 102. Upon determining the one or more charging stations 112 that may be located within a distance that the EV 102 may travel based on the SOC of the battery 106 of the EV 102, the charging station determinant module 406 may communicate data pertaining to the one or more charging stations 112 to the map presentation module 410 of the smart charge application 118.

The method 600 may proceed to block 610, wherein the method 600 may include presenting a charging station map user interface with one or more charging stations 112. In one embodiment the map presentation module 410 may present the charging station map interface through the display unit of the EV 102 and/or through the display of the portable device 222. The charging station map interface may be presented as a map that may pin point one or more charging stations 112 that may be determined to be within the predetermined distance of the EV 102, as determined by the charging station determinant module 406. Additionally, the charging station map interface may pin point one or more charging stations 112 that may be determined to be located within a distance that the EV 102 may travel to reach the charging station(s) 112 based on the current geo-location of the EV 102, the current SOC of the battery 106 of the EV 102, and/or one or more road types that may be located within a vicinity of the current geo-location of the EV 102.

The charging station map interface may present information that may pertain to the one or more charging stations 112 that may be pin pointed. Such information may include, but may not be limited to, perspective and/or real-time price data, information regarding queues and/or wait times that are associated to respective charging stations 112, information regarding fast charging capabilities, and/or pricing incentives that may be provided by the respective charging stations 112.

Figure 7:
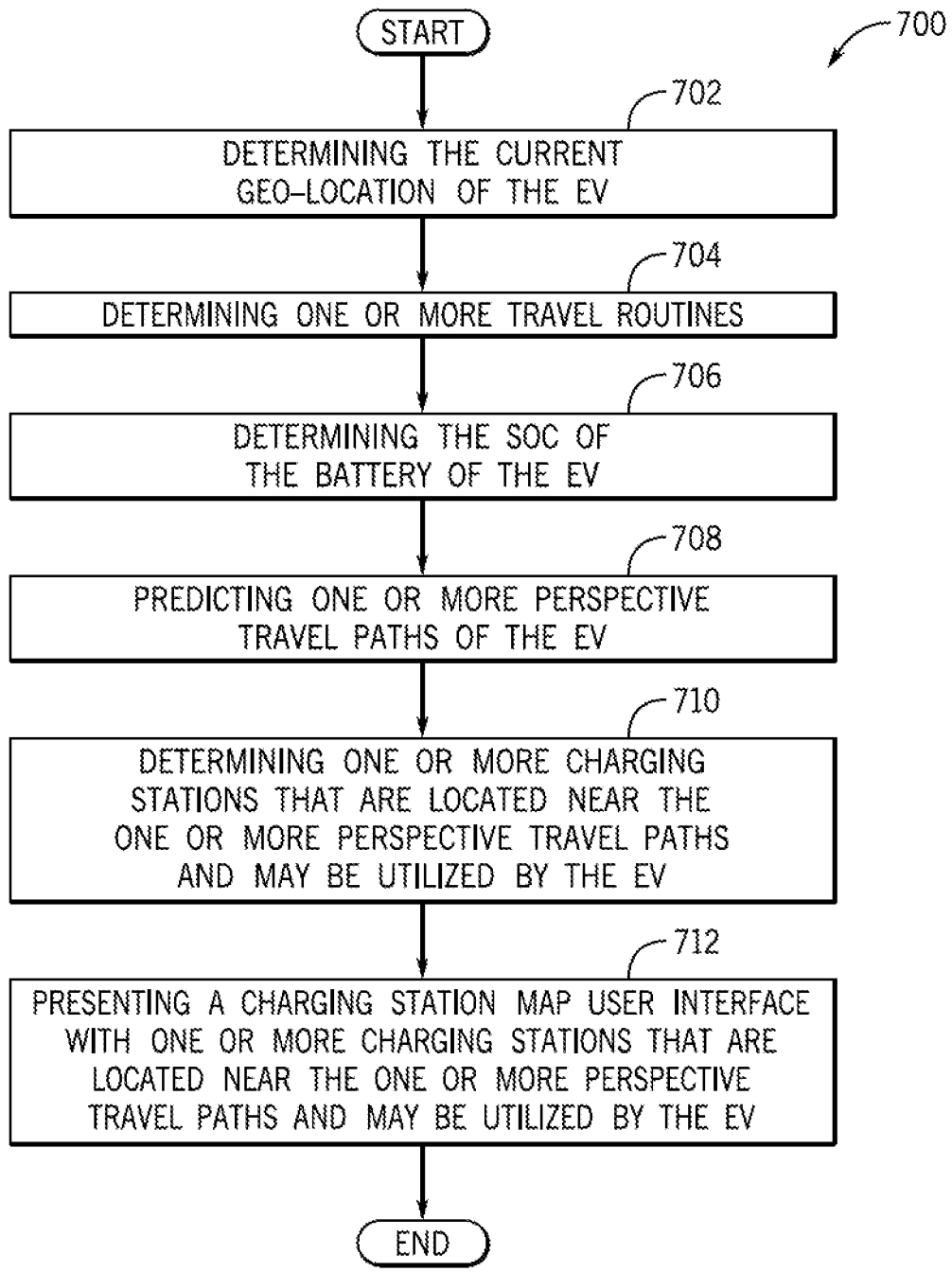
FIG. 7 is a process flow diagram of a method for presenting the charging station map user interface with one or more charging stations that are located near one or more perspective travel paths that may be utilized by the EV 102 according to an exemplary embodiment of the present disclosure.

FIG. 7 is a process flow diagram of a method 700 for presenting the charging station map user interface with one or more charging stations that are located near one or more perspective travel paths that may be utilized by the EV 102 according to an exemplary embodiment of the present disclosure. FIG. 7 will be described with reference to the components of FIG. 1, FIG. 2, FIG. 3, and FIG. 4, through it is to be appreciated that the method 700 of FIG. 7 may be used with additional and/or alternative system components. The method 700 may begin at block 702, wherein the method 700 may include determining the current geo-location of the EV 102.

In an exemplary embodiment, the location determinant module 402 may be configured to communicate with the GPS 210 of the EV 102 to determine the current geo-location of the EV 102 at one or more points in time. In some embodiments, the location determinant module 402 may be configured to store the one or more geo-locations of the EV 102 determined at one or more points in time within the data store 208 of the vehicle computing device 202 and/or the data store 308 of the remote server 108.

The method 700 may proceed to block 704, wherein the method 700 may include determining one or more travel routines. As discussed above, the location log 224 stored on the data store 208 of the vehicle computing device 202 may include a log of locations at which the EV 102 is driven, parked, and/or charged. In one configuration, the travel path prediction module 408 may analyze the location log 224 to determine one or more point of interest locations that may be frequently and/or routinely traveled to by the EV 102. In particular, the travel path prediction module 408 may analyze point of interest data (not shown) that may be stored on the data store 208 of the vehicle computing device 202 and/or the data store 308 of the remote server 108 to determine one or more points of interest locations that may be frequently and/or routinely traveled to by the EV 102.

Upon analyzing the location log 224, the travel path prediction module 408 may be configured to determine one or more travel routines that may be followed by the operator of the EV 102. In some configurations, the one or more travel routines may be analyzed through the neural network to provide computer/machine based/deep learning techniques to determine whether a particular trip of the EV 102 is a routine trip or non-routine trip based on the analysis of data provided by the GPS 210.

The method 700 may proceed to block 706, wherein the method 700 may include determining the SOC of the battery of the EV 102. In one configuration, the SOC determinant module 404 may be configured to communicate with the processor 204 of the vehicle computing device 202 to determine the current SOC of the battery 106 of the EV 102. In one embodiment, the processor 204 may be configured to communicate with a micro-processor (not shown) that may be included as part of electrical circuitry of the battery 106 to determine a current SOC of the battery 106. The SOC determinant module 404 may be additionally configured to analyze the current geo-location of the EV 102 and determine a remaining distance that the EV 102 is capable of traveling. The remaining distance may be determined based on analyzing the current SOC of the battery 106, an average speed of the EV 102, and/or one or more road types (e.g., local, highway, road grades) that may be located within a vicinity of the current geo-location of the EV 102. Upon determining the current SOC and remaining distance that the EV 102 may travel at the average speed of the EV 102, the SOC determinant module 404 may communicate respective data to the travel path prediction module 408 and/or the charging station determinant module 406.

The method 700 may proceed to block 708, wherein the method 700 may include predicting one or more perspective travel paths of the EV 102. In one embodiment, the travel path prediction module 408 may analyze the current geo-location of the EV 102 at one or more points in time with respect a particular timeframe of utilization of the EV 102, the current SOC of the battery 106 of the EV, the remaining distance that the EV 102 may travel, and/or one or more routine trips that may be determined (at block 704) to thereby predict one or more perspective travel paths (e.g., routes, roads, highways, etc.) that may be utilized by the EV 102 to reach one or more points of interest locations that may be frequently and/or routinely traveled to by the EV 102. The travel path prediction module 408 may thereby communicate data pertaining to the perspective travel routes to the charging station determinant module 406.

The method 700 may proceed to block 710, wherein the method 700 may include determining one or more charging stations 112 that are located near one or more perspective travel paths and that may be utilized by the EV 102. In one embodiment, upon receiving data pertaining to one or more perspective travel routes of the EV 102, the charging station determinant module 406 may be configured to access and query the station database 314 to determine one or more charging stations 112 that may be located within a predetermined distance of one or more perspective travel paths that are predicted to be utilized by the EV 102 based on one or more travel routines of the operator of the EV 102, the current geo-location of the EV 102, the current SOC of the EV 102, and/or the remaining distance that the EV 102 may travel.

Accordingly, the charging station determinant module 406 may determine one or more charging stations 112 that may be located on or near one or more perspective travel paths of the EV 102 as predicted by the travel path prediction module 408 and that may be located within a distance that is reachable by the EV 102 based on associated perspective SOC levels of the battery 106 that may be predicted by the SOC determinant module 404, as discussed above. In one embodiment, the charging station determinant module 406 may be configured to communicate data associated with the one or more charging stations 112 that are determined to be located near the one or more perspective travel paths to the map presentation module 410 of the smart charge application 118.

The method 700 may proceed to block 712, wherein the method 700 may include presenting a charging station map user interface with one or more charging stations 112 that are located near the one or more perspective travel paths and may be utilized by the EV 102. In an exemplary embodiment, the map presentation module 410 of the smart charge application 118 may be configured to present one or more charging station map user interfaces that may present the map of one or more charging stations 112 that are determined to be located near the one or more perspective travel paths and that may be utilized by the EV 102. In particular, the one or more charging stations 112 that are determined to be located near the one or more perspective travel paths and that may be utilized by the EV 102 may be presented as pin pointed to allow the operator to determine the location of the charging station(s) 112 with respect to the current or perspective (predicted) locations of the EV 102.

In one or more embodiments, the charging station map interface may present information that may pertains to the one or more charging stations 112 that may be pin pointed. Such information may include, but may not be limited to, perspective and/or real-time price data, information regarding queues and/or wait times that are associated to respective charging stations 112, information regarding fast charging capabilities, and/or pricing incentives that may be provided by the respective charging stations 112.

Figure 8:
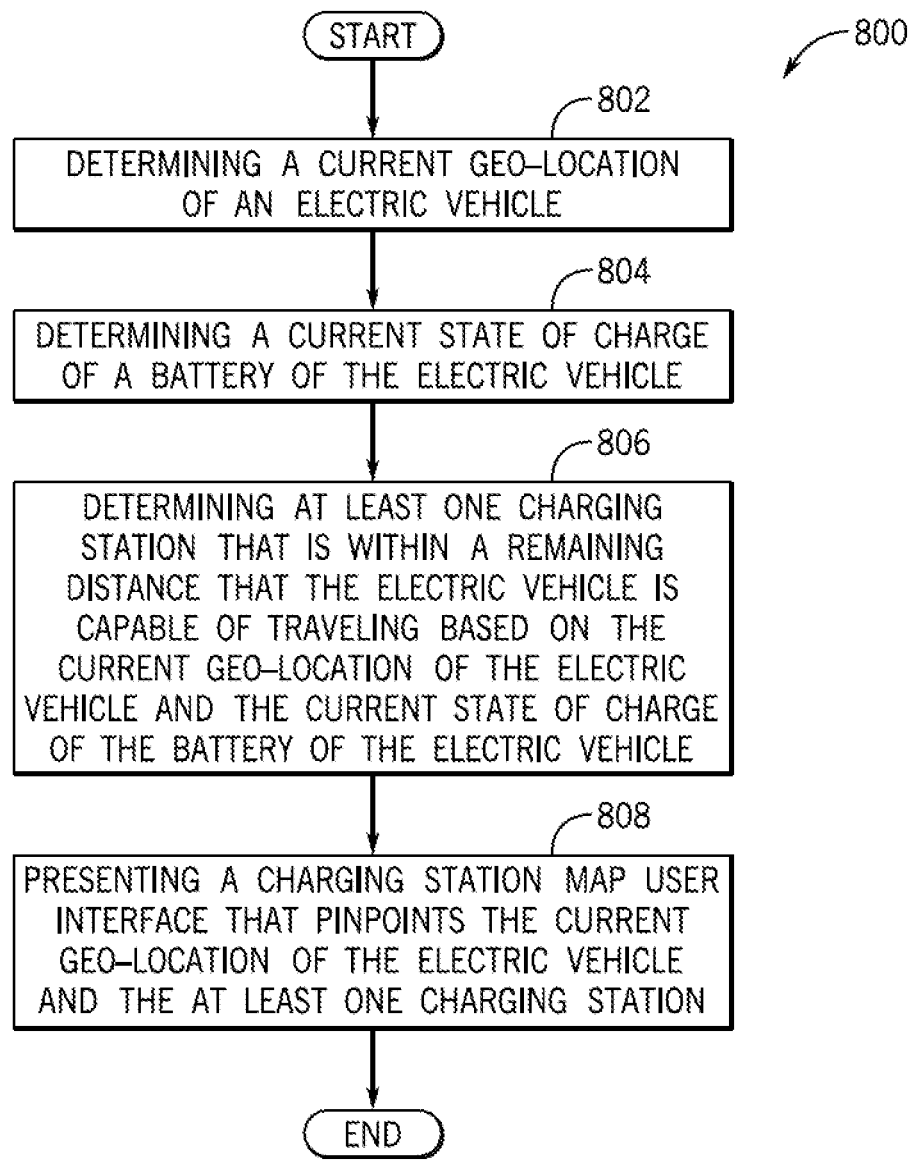
FIG. 8 is a process flow diagram of a method for presenting electric vehicle charging options according to an exemplary embodiment of the present disclosure.

FIG. 8 is a process flow diagram of a method 800 for presenting electric vehicle charging options according to an exemplary embodiment of the present disclosure. FIG. 8 will be described with reference to the components of FIG. 1, FIG. 2, FIG. 3, and FIG. 4, through it is to be appreciated that the method 800 of FIG. 8 may be used with additional and/or alternative system components. The method 800 may begin at block 802, wherein the method 800 may include determining a current geo-location of an EV 102.

The method 800 may proceed to block 804, wherein the method 800 may include determining a current state of charge of a battery 106 of the EV 102. The method 800 may proceed to block 806, wherein the method 800 may include determining at least one charging station 112 that is within a remaining distance that the EV 102 is capable of traveling based on the current geo-location of the EV 102 and the current state of charge of the battery 106 of the EV 102. The method 800 may proceed to block 808, wherein the method 800 may include presenting a charging station map user interface that pin points the current geo-location of the EV 102 and the at least one charging station 112.

Figure 9:
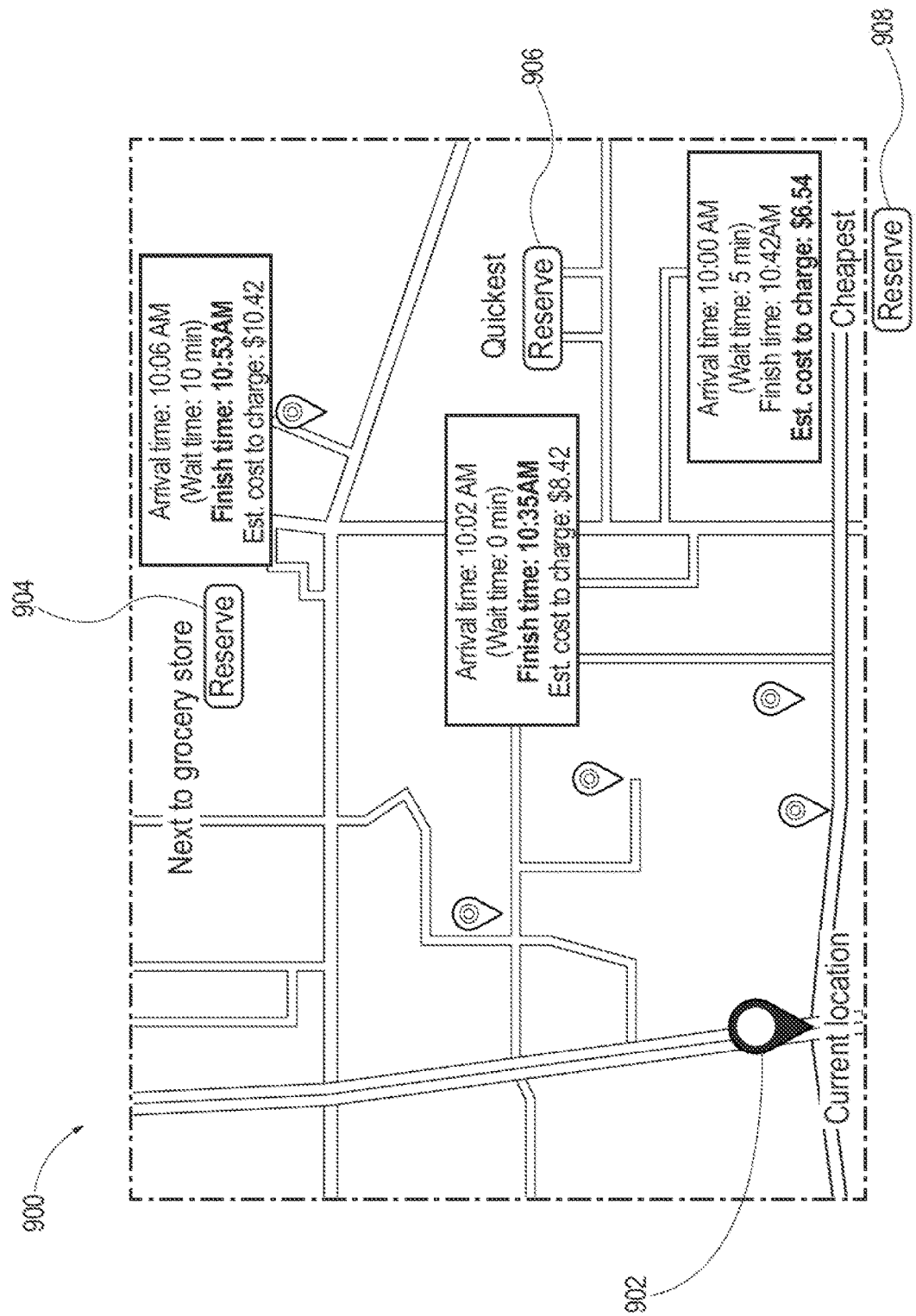
FIG. 9 is an illustrative example of a charging station map user interface for use with a user interface according to an exemplary embodiment of the present disclosure.

FIG. 9 is an illustrative example of a charging station map user interface 900 for use with a user interface according to an exemplary embodiment of the present disclosure. The charging station map user interface 900 is a charging station map user interface as described above. The charging station map user interface 900 may include user interface selectable geo-locations. Presenting a charging station map user interface that pin points the current geo-location of the electric vehicle and each of the charging stations of the plurality of charging stations may include applying reservation selection inputs, related charging information, and/or a label. The reservation selection inputs allow a user to select an icon to reserve a time or position in a queue associated with a charging station. The related information includes information about the charging stations, electric vehicles, environment, etc. A label identifies a characteristic of a charging station, such as an amenity, feature, or location.

Labels define categories of amenities. A label being applied to a charging station indicates that that the charging station has satisfied the conditions of that label. For example, the category of the label may be based on the dynamic pricing scheme. Suppose that the label is "Cheaper" such that the condition of the label is to only include those charging stations with a charge per kilowatt hour below a threshold value. Charging stations that satisfy the threshold value are annotated with the label "Cheaper." Furthermore, the labels may be tiered. For example, as an addition or alternative, the category based on the dynamic pricing scheme may include a label "Cheapest." The "Cheapest" label may be applied to the charging station having the lowest pricing per kilowatt hour. In this manner, a single category may include multiple labels.

As another example of a category, the categories may include charging stations that are capable of fast charging or provide electricity sourced from clean renewable energy sources. For example, charging stations may be labeled as "renewable" if the charging station sources energy from a renewable energy source. In some embodiments, a label may be indicative of certain benefits such as lower pricing or faster charging can be provided during high renewable energy times. Therefore, in addition to the interface allowing the EV operator to visually compare charging rates, charging infrastructure, charging queues, and/or additional charging related information that may pertain to various charging stations 112 relative to the current location 902 of the EV operator or the EV 102. The smart charge application 118 may annotate various charging stations 112 with labels that identify features of the various charging stations 112 that exist in the category. The reservation selection inputs may allow the EV operator reserve a time and/or position in the queue for a charging station 112 by selecting the reservation selection input.

For example, a charging station 112 may be associated with a first reservation selection input 904 that identifies a particular amenity or category of amenity. The amenity or category of amenity may include a label such as "Next to Grocery Store." A second reservation selection input 906 may have a label that identifies a charging station 112 as the "Quickest" in the map area of the charging station map user interface 900. The determination that a charging selection is the quickest may be based on the charging queue or the charging speed. For example, the quickest may be determined based on real time information from EVs currently charging at the charging station to determine when a currently charging EV will finish. A third reservation selection input 908 may be associated with a label that identifies a charging station 112 as the "Cheapest." The determination that a charging selection is the cheapest may be based on a dynamic pricing scheme, load on the grid, source of electricity, etc. Accordingly, the reservation selection inputs may include labels that identify different incentives, amenities, and/or categories of amenities associated with the different charging stations. In this manner, a users' charging behavior may be shifted when the load on grid is expected to be high, by increasing the charging price during those times. Thus, the labels can facilitate managing the load on the grid.

The labels may be determined based on related charging information may be based on the current location 902 of the EV 102 as well as other vehicle information including, for example, the speed, direction, planned path of the EV 102, etc. The labels may further be based on related charging information specific to the charging stations, such as the location of the charging station, relative distances between the charging station and other points of interest (e.g., coffee shops, gas stations, grocery stores, parks, attractions, etc.) The labels may be calculated based on one or more aspects of the related charging information and presented as a superlative.

Whether the charging data is based on the EV 102, vehicle information, charging data, and/or the charging station, the data may be collected in real-time via an operable connection for computer communication with the EV 102 and/or the remote server 108, for example, to transmit and receive data, as discussed above. In another embodiment, perspective and/or real-time price data may include charging rates during a certain period of time (e.g., hourly, daily, weekly), charging rates to charge the EV 102 at various charging speeds (e.g., conventional electric vehicle charging speed, fast electric vehicle charging speed, charging power levels) from one or more charging stations.

The EV operator may select a number of categories to be illustrated on the charging station map user interface 900 based on the EV operator's preferences. For example, the EV operator may always want the "Quickest" and "Cheapest" shown but not "Next to Grocery Store." The EV operator may additionally or alternatively select other categories, such as an Available Public Bathrooms category, a Near Coffee category, near a particular coffee chain category, etc. The EV operator may also apply aggregate user ratings to a category. For example, Available Public Bathrooms with a user rating at or above 4 stars. Therefore, other EV operators may influence the categories and the resulting labels by, for example, rating amenities, leaving comments, categorizing amenities, etc.

Furthermore, the categories may be user defined. For example, distance based categories may have threshold distances selected by the user. The term "next to" may be EV operator defined as with a half mile of the charging station 112 while "near" may be EV operator defined as within two miles of the charging station 112. In this manner, more than one charging station 112 may have a reservation selection input. For example, if the user selects to have "Next to Grocery Store" displayed on the charging station map user interface 900, any charging station 112 within a half mile of a grocery store may be illustrated with a "Next to Grocery Store" reservation selection input. In another embodiment, the term "next to" may indicate the charging station 112 that is geographically or path-based closest to an amenity. For example, only the charging station 112 closest to a grocery store may be illustrated with a "Next to Grocery Store" reservation selection input.

In addition to displaying the reservation selection inputs for selected categories, the smart charge application 118 may display selected charging information such as the arrival time, wait time, finish time, estimated cost to charge, etc. so that the EV operator can quickly assess the information that reservation selection inputs are based on. For example, suppose that the second reservation selection input 906 identifies a charging station 112 as the "Quickest" with a Quickest Label having no wait time, but the third reservation selection input 908 identifies another charging station 112 as the "Cheapest" with a Cheapest Label having only a five minute wait time. The EV operator may prefer the third reservation selection input 908 because it is the cheapest if the associated charging station 112 only has a five minute wait. Alternatively, the EV operator may prefer the second reservation selection input 906 because it is the quickest if the associated charging station 112 is only $1.88 more expensive. In this manner, a reservation selection input may be illustrated for charging station 112 with related charging information.

The arrival time of the EV 102 for the related charging information may be based on the current location 902 of the EV 102 as well as other vehicle information including, for example, the speed, direction, planned path of the EV 102, etc. The wait time may be based on the current queue at the charging station 112 or the expected queue at the charging station 112 at the arrival time. The finish time may be based on real-time data, such as the SOC of the EV 102, the expected SOC of the EV 102 at the arrival time, the charging speed of the charging station 112, the EV operator preferences, the wait caused by any vehicle currently charging at the charging station, etc. For example, determining the finish time may include receiving real-time data from at least one charging station within the remaining distance or within the remaining distance within a predetermined distance of the at least one perspective travel path of the electric vehicle. Accordingly, information about currently charging electric vehicles at the charging stations may be used to determine the finish time of the EV 102. Likewise, the estimated cost to charge the EV 102 may also be based on the SOC of the EV 102, the expected SOC of the EV 102 at the arrival time, the charging speed of the charging station 112, the EV operator preferences, etc. Accordingly, EV operators may reserve the at least one charging station for charging the electric vehicle by selecting one or more labels based on incentives, amenities, categories of amenities.

In some embodiments, the charging information may be visually emphasized based on the label associated with the reservation selection inputs. For example, if the second reservation selection input 906 is labeled "Quickest" then the related charging information for Finish Time may be emphasized whereas if the third reservation selection input 908 is labeled "Cheapest" then the Estimated Cost to Charge may be emphasized. The emphasis on the charging station map user interface 900 may be illustrated with fonts that are bold, underlined, italicized, in color, and/or highlighted, among others.

Figure 10:
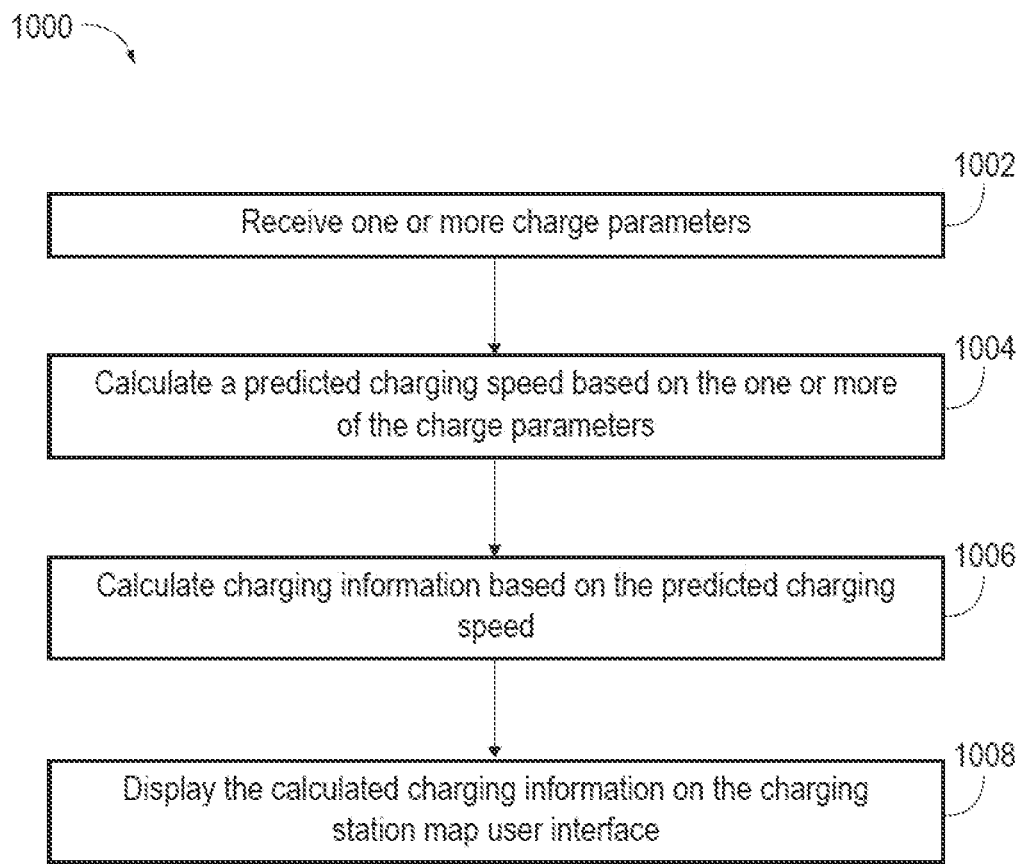
FIG. 10 is a process flow diagram of a method for calculating a predicted charging speed according to an exemplary embodiment of the present disclosure.

FIG. 10 is a process flow diagram of a method for charge speed prediction according to an exemplary embodiment of the present disclosure. At block 1002, the method 1000 includes receiving one or more charge parameters. As discussed above, the smart charge application 118 may determine a Finish Time based on the charging speed of the charging station 112. The charging speed of the charging station 112 may be based on a number of the charge parameters including the anticipated temperature at the location of the charging station 112, temperature of the battery 106 of the vehicle 102, SOC of the vehicle 102, and utilization of multiple charging stations by other vehicles at the charging location, among others.

The charge parameters describe one or more aspects of charging of vehicles using the charging infrastructure, such as the charging station 112. The charge application 118 may receive one or more of the charge parameters as real-time data from at least one charging station, such as the charging station 112. For example, the charging station determinant module 406 may receive charge parameters such as the anticipated temperature at the location of the charging station 112, the utilization of multiple charging stations by other vehicles at the charging location, etc. Additionally or alternatively, the charge parameters may be received from the vehicle 102. For example, the state of charge determinant module 404 may receive charge parameters such as the temperature of the battery 106 and estimated SOC.

The charge parameters may also be received from the remote server 108 or the charging station computing infrastructure 116. For example, the charge parameters may include historical data for the vehicle 102 and/or the charging station 112. For example, regardless of the optimum charging speed of the charging station, the charging station historical data may indicate that the average charging speed of the charging station is lower. Furthermore, the historical data may be based on tiers associated with charging speeds of the charging station 112 such as a fast charging tier as opposed to a default/conventional charging tier. Accordingly, the charging station historical data may include an average charging speed for the fast charging tier and an average charging speed for the default/conventional charging tier.

The charging station historical data may also include charge parameters for previous charging sessions for the vehicle 102 as well as other vehicles, such as the additional electric vehicle 120. The charge parameters for the previous charging sessions may include a time of day, a season, a region, a time zone, charge speed, charge voltage, the duration of the charging session, amount of charge received, initial SOC of the charged vehicle, etc. The charge parameters for previous charging sessions may be received from the vehicle that participated in the charging station, the remote server 108, the charging station 112, and/or the charging station computing infrastructure 116

At block 1004, the method 1000 includes the travel path module 408 calculating a predicted charging speed based on the one or more of the charge parameters. The predicted charging speed is the estimated speed that a specific charging station is predicted to provide a charge to the vehicle 102 were the vehicle to charge at that charging station. The predicted charging speed may be an average speed, a previous speed of charging under similar charging parameters (e.g., number of vehicles being charged, weather, demand on the grid, etc.)

The smart charge application 118 may calculate the predicted charging speed based on weighting the one or more charge parameters, modeling the one or more charge parameters, and/or averaging the one or more charge parameters. For example, even if the max charge speed/power that the vehicle is capable of is 77 kW, the vehicle may actually take in/achieve charge speed of 72 kW on average during a 30-minute charging session (i.e., charging speed fluctuate between 68 kW and 77 kW for example), because of the charge parameters that influence actual charging speed the vehicle achieves.

The smart charge application 118 may generate a prediction model that extracts one or more charge values from the one or more charge parameters. For example, the one or more charge values may include historical data from the vehicle 102. The smart charge application 118 may extract previous charging speed values as charge value for times, seasons, etc., similar to the current time, season, etc. In another embodiment, the charge values may be extracted from historical data associated with another vehicle 120. The charging values may be extracted from the one or more charge parameters based on a speed function associated with the prediction model. For example, the prediction model may identify specific categories of data that can be modeled by the prediction model. Therefore, rather than utilizing all of the charging parameters, only the relevant charging values are extracted. Accordingly, the charging values may be a subset of data extracted from a set of the one or more charge parameters.

The charging values may be extracted from the real-time data received by the smart charge application 118. For example, the charge values may be extracted from the one or more charging parameters, such as weather data. In some embodiments, the charging values may be extracted from the charging parameters based on one or more functional thresholds. A functional threshold defines ranges of values that may affect charging speed. For example, suppose that charge values are being extracted from weather data and that cold weather below 55° F. affects charging speed. The temperature 55° F. may be defined as a functional threshold such that charging values are extracted from charging parameters associated with charging sessions having temperature below 55° F. In this manner, the prediction model may be generated based on charge values extracted from the one or more charge parameters according to functional thresholds. In this manner, the subset of charging values may be extracted according to a functional threshold.

The prediction model may weigh the one or more charging values with one or more weighting coefficients to be multiplied by the charging values. The prediction model may acquire weighting coefficients of charging parameters based on the speed function of the prediction model. The prediction model may include one or more speed functions.

A speed function may be selected for the prediction model based on the charging parameters. The speed functions may represent the correspondence between the functional performance of vehicles that have been charged by the charging station 112, other charging stations at the location of the charging station, the vehicle 102, or other vehicles. The selected speed function may include one or more speed functions, functional thresholds, and/or weighting coefficients.

Calculating the predicted charging speed based on the one or more charge parameters may include generating a prediction model, extracting the charge values from the one or more charge parameters, and/or weighting the extracted charge values. As described above, generating the prediction model may include selecting a speed function from a set of speed functions. Extracting the charge values may be based on a speed function and/or one or more functional thresholds. For example, the speed function may be associated with charge values from the one or more charge parameters. Furthermore, the speed function may include weighting coefficients of charging parameters that are applied to the charge values to calculate the predicted charging speed.

At block 1006, the method 1000 includes the smart charge application 118 calculating charging information based on the predicted charging speed. As discussed above, the charging information may include the Finish Time, estimated cost to charge, etc. Because the charging speed impacts the total cost and time to finish charging for the vehicle, the charging information is calculated based on the predicted charging speed. For example, the travel path prediction module 408 may calculate the Finish Time based on the estimated arrival time of the vehicle 102 and the predicted charging speed.

At block 1008, the method 1000 includes displaying the calculated charging information such as the Finish Time, estimated cost to charge, etc. so that the EV operator can quickly assess the information that reservation selection inputs are based on. The charging information is displayed on the charging station map user interface 900 in a similar manner as described above with respect to FIG. 8 and FIG. 9. For example, the map presentation module 410 may present the charging station map user interface 900 through the display unit of the EV 102 and/or through the display of the portable device 222.

As described above, displaying the calculated charging information may include presenting labels for one or more of the charging stations shown on the charging station map user interface 900. For example, the charging information may be visually emphasized based on the label associated with the reservation selection inputs. Suppose that the charging information includes an estimated Finish Time based on the predicted charging speed. In addition to displaying the estimated Finish Time for the charging station 112, the charging station map user interface 900 may present the charging station 112 with a label based on the charging information, here the Finish Time. For example, a label "Fastest Charging Time" may be presented with the charging station 112 if the charging station 112 is predicted to finish charging the electric vehicle 102 before other charging station of the plurality of charging stations.

Figure 11:
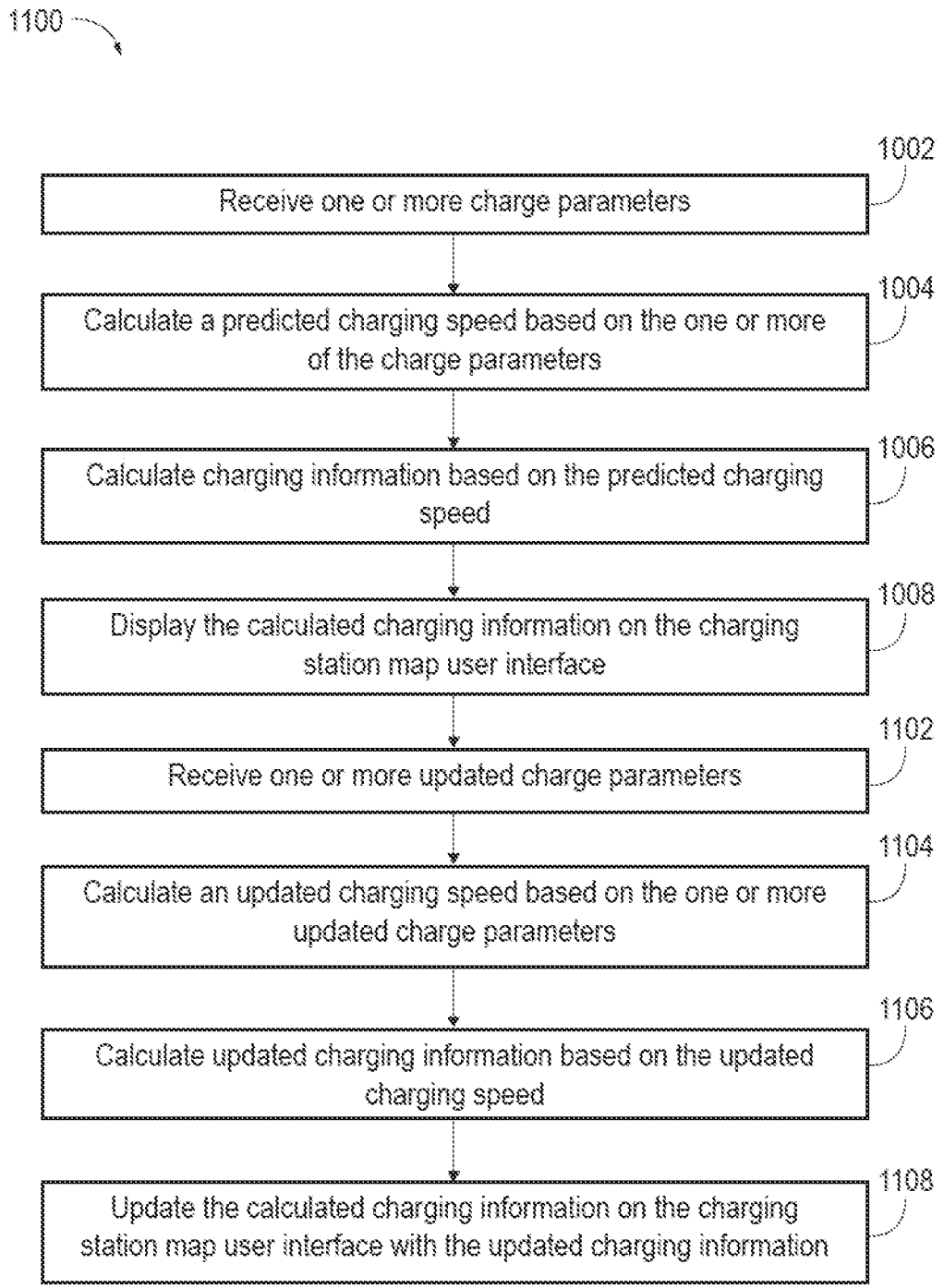
FIG. 11 is a process flow diagram of a method for updating a predicted charging speed according to an exemplary embodiment of the present disclosure.

FIG. 11 is a process flow diagram of another method for charge speed prediction according to an exemplary embodiment of the present disclosure. Because the charge parameters may receive in real-time to reflect the current situation of the vehicle 102 or the charging station, the charging parameters are dynamic and may change, which results in changes to the predicted charging speed.

At block 1102, the method 1100 includes the smart charge application 118 receiving updated charge parameters. Previously received charge parameters may be first charge parameters that may have been received by the smart charge application 118 at a first time earlier than a second time. The updated charge parameters (i.e., second charge parameters) are received at the second time after the first time. The updated charge parameters may be received periodically, according to a schedule, or based on a query from the smart charge application 118. The smart charge application 118 may request updated charge parameters in response to certain trigger events. For example, being a threshold distance from one or more charging stations of the at least one charging station may be a trigger event. In other embodiments a trigger even may cause updated charge parameters to be sent to the smart charge application 118. For example, suppose the remote server 108 receives information regarding a spike in demand on the electrical grid. The spike may be deemed a trigger event, for example, if the spike exceeds a threshold demand. Accordingly, the remote server 108 may send updated charge parameters regarding the spike to the smart charge application 118 in response to the trigger event.

At block 1104, the method 1100 includes the travel path module 408 calculating an updated charging speed based on one or more of the updated charge parameters. The updated charging speed is calculated in a similar manner as the predicted charging speed, described above with respect to FIG. 10. However, the updated charging speed is based on the updated charge parameters. The updated charging speed is a revised estimate of the predicted charging speed.

In some embodiments, the updated charging speed may be calculated based on the prediction model used to calculate the predicted charging speed. For example, extracting updated charge values from the one or more updated charge parameters, and/or weighting the extracted charge values in a similar manner as described above with respect to FIG. 10. Alternatively, an updated prediction model may be generated to calculate the updated charging speed. For example, the updated prediction module may be based on a different speed function than the speed function of the initial prediction model. The speed function may be different based on the updated charge parameters. Suppose that a first speed function is selected for the prediction model based on the first charge parameters, which are based on historical data. A second speed function, different than the first speed function, may be selected if the updated charge parameters are not based on historical data, but rather real-time data received from the charging station 112, charging entity, the vehicle 102, etc. Accordingly, the travel path prediction module 408 selects a speed function based on the received charge parameters and/or the updated charge parameters.

Updated charge values may be extracted from the one or more updated charge parameters based on the selected speed function. Suppose the speed function is the same speed function used by the prediction model to calculate a charge speed at the first time. The updated charge values may be extracted in a similar manner, for example, based on the same one or more functional thresholds and/or the same weighting coefficients. Alternatively, if the speed function is different, the prediction model may use different functional thresholds and/or weighting coefficients to accommodate the different updated charge parameters. In this manner, the prediction model is dynamic and can be tailored to the charging parameters that are being received in real time.

At 1106, the method 1100 includes calculating updated charging information based on the updated charging speed. As discussed above, the charging information may include the Finish Time, estimated cost to charge, etc. The updated charging information is calculated in a similar manner as the charging information, described above. For example, the travel path prediction module 408 may calculate an updated Finish Time based on the estimated arrival time of the vehicle 102 and the updated charging speed.

At 1108, the method 1100 includes updating the calculated charging information on the charging station map user interface 900 with the updated charging information. In some embodiments, the updated charging information may not change. For example, the Finish Time calculated based on the charge parameters may be similar to the updated Finish Time. Updating the calculating charging information with the updated charging information may include comparing the charging information to the updated charging information. Suppose, that the charging time and updated charging information are directed to the Finish Time. The Finish Time based on the initial charging information calculated for a first time is 10:35 AM, whereas the Finish Time based on the updated charging information calculated for the second time is 10:45 AM. Accordingly, updating the Finish Time may include adjusting the charging station map user interface 900 to present the Finish Time as 10:45 AM.

In some embodiments, the updating the calculated charging information with the updated charging information, may further include calculating a difference between the calculated charging information and the updated charging information, and comparing the difference to an update threshold. The update threshold may be a minimum difference between the calculated charging information and the updated charging information that is satisfied before adjusting the charging station map user interface 900.

Continuing the example from above, suppose that the Finish Time, based on the initial charging information calculated for a first time, is 10:35 AM, the Finish Time, based on the updated charging information calculated for the second time, is 10:45 AM, and the update threshold is fifteen minutes. Because the difference between the initial charging information calculated for a first time, 10:35 AM, and the Finish Time based on the updated charging information calculated for the second time, 10:45 AM, is ten minutes which does not satisfy the fifteen minute update threshold, the charging station map user interface 900 would not be adjusted to present the Finish Time as 10:45 AM instead of 10:35 AM. Now suppose that the update threshold is five minutes. Because the difference of ten minutes exceeds the five-minute update threshold, the charging station map user interface 900 would be adjusted to present the Finish Time as 10:45 AM instead of 10:35 AM.

In another embodiment, updating the calculated charging information on the charging station map user interface 900 with the updated charging information may include changing a label on the charging station map user interface 900. For example, the updated charging information may change the Finish Time for one or more charging stations. Accordingly, updating the calculated charging information with the updated charging information may affect multiple charging stations, labels, and/or charging information presented on the charging station map user interface 900.

As discussed above with respect to FIG. 9, the second reservation selection input 906 may have a label that identifies a charging station 112 as the "Quickest" in the map area of the charging station map user interface 900. The determination that a charging selection is the quickest may be based on the charging speed associated with the charging information. For example, the quickest may be determined based on the Finish Time calculated for the first time. The third reservation selection input 908 may be associated with a label that identifies a charging station 112 as the "Cheapest." However, because the updated charging information calculated for the second time, 10:45 AM is after the Finish Time associated with the third reservation selection input 908, as 11:42 AM the labels may be adjusted on the charging station map user interface 900. For example, adjusting the charging station map user interface 900 to remove the "Quickest" label from the second reservation selection input 906 and apply the "Quickest" label to the third reservation selection input 908. Although described with respect to the Finish Time being the relevant charging information, the charging information may be the estimated cost to charge the vehicle 102. In a similar manner, updating the labels may include changing the "Cheapest" label.

Figure 12:
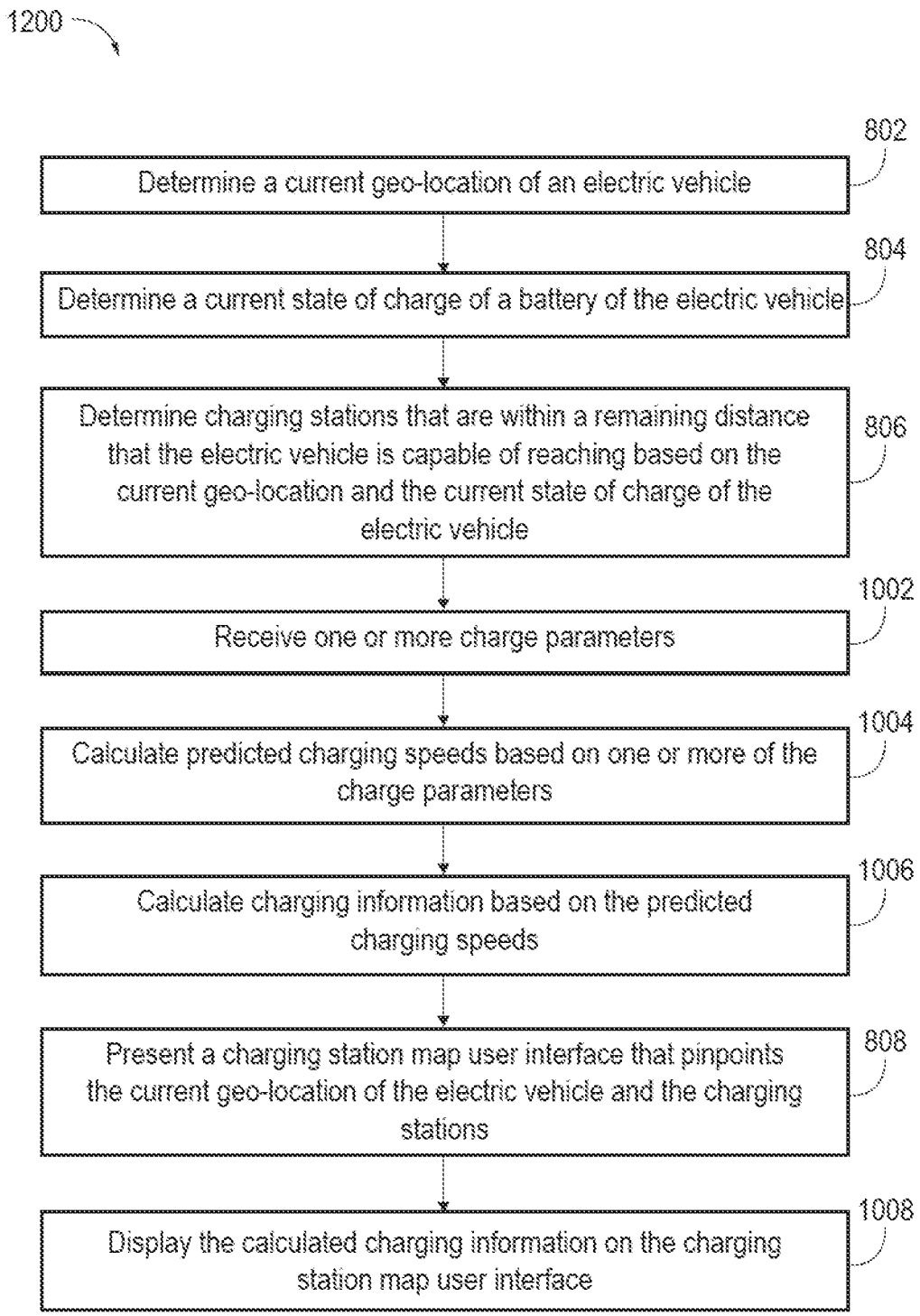
FIG. 12 is a process flow diagram of a method for presenting the charging station map user interface with charging information according to an exemplary embodiment of the present disclosure.

FIG. 12 is a process flow diagram of a method for presenting the charging station map user interface with charging information according to an exemplary embodiment of the present disclosure. The blocks described below operate in a similar manner as described above with respect to FIGS. 8, 9, and 10.

At block 802, the method 1200 includes determining a current geo-location of an electric vehicle 102. The location determinant module 402 may be configured to communicate with the GPS 210 of the EV 102 to determine the current geo-location of the EV 102 at one or more points in time, such as the first time and the second time. In some embodiments, the location determinant module 402 may be configured to store the one or more geo-locations of the EV 102 determined at one or more points in time within the data store 208 of the vehicle computing device 202 and/or the data store 308 of the remote server 108.

At block 804, the method 1200 includes determining a current state of charge of a battery of the electric vehicle 102. For example, the SOC determinant module 404 may be configured to determine the SOC of the battery 106 of the EV 102 at one or more points in time based on communication with the processor 204 of the vehicle computing device 202 of the EV 102. The SOC determinant module 404 may be additionally configured to analyze the current geo-location of the EV 102 and determine a remaining distance that the EV 102 is capable of traveling. The remaining distance may be determined based on analyzing the current SOC of the battery 106, an average speed of the EV 102, and/or one or more road types (e.g., local, highway, road grades) that may be located within a vicinity of the current geo-location of the EV 102. Upon determining the current SOC and remaining distance that the EV 102 may travel at the average speed of the EV 102, the SOC determinant module 404 may communicate respective data to the charging station determinant module 406.

At block 806, the method 1200 includes determining at least one charging station that is within a remaining distance that the electric vehicle 102 is capable of reaching based on the current geo-location and the current state of charge of the electric vehicle 102.

At block 1002, the method 1200 includes receiving one or more charging parameters associated with the at least one charging station that is within a remaining distance that the electric vehicle 102. For example, as shown in FIG. 9, multiple charging stations associated with the first reservation selection input 904, the second reservation selection input 906, and the third reservation selection input 908 may be shown on the charging station map user interface 900.

The one or more of the charge parameters may be received as real-time data from at least one charging station, such as the charging station 112. Additionally or alternatively, the charge parameters may be received from the vehicle 102 such as the temperature of the battery 106 and estimated SOC of the vehicle 102. The charge parameters may also be received from the remote server 108 or the charging station computing infrastructure 116. For example, the charge parameters may include historical data for the vehicle 102 and/or the charging station 112. For example, regardless of the optimum charging speed of the charging station, the charging station historical data may indicate that the average charging speed of the charging station is lower. Furthermore, the historical data may be based on tiers associated with charging speeds of the charging station 112 such as a fast charging tier as opposed to a default/conventional charging tier. Accordingly, the charging station historical data may include an average charging speed for the fast charging tier and an average charging speed for the default/conventional charging tier.

At block 1004, the method 1200 includes calculating a predicted charging speed for the at the at least one charging station based on one or more of the charge parameters. When the at least one charging station includes multiple charging stations, a predicted charging speed may be calculated for one or more of the multiple charging stations. In some embodiments, the same prediction model may be used to calculate the predicted charging speeds for each of the multiple charging stations. In another embodiment, different prediction models may be used for one or more of the multiple charging stations. The different prediction models may be selected based on the one or more charging parameters received for a charging station. For example, suppose that a first set of charging parameters is received for a charging station associated with the first reservation selection input 904, a second set of charging parameters is received for a charging station associated with the second reservation selection input 906, and a third set of charging parameters is received for a charging station associated with the third reservation selection input 908. The first set of charging parameters may be associated with a first speed function, whereas the second or third set of charging parameters may be better fitted to a second speed function. Therefore, the prediction model generated may include both the first speed function and the second speed function. In this manner, the prediction model may include a number of speed functions based on the one or more charging parameters received. Alternatively, a first prediction model may be used for first set of charging parameters while a second prediction model may be used for the second and third set of charging parameters. In some embodiment, the second and/or third set of charging parameters may include updated charging parameters.

At block 1006, the method 1200 includes calculating charging information for the at the at least one charging station based on the predicted charging speed. In a similar manner as described above with respect to FIG. 10, charging information may calculated for multiple charging stations. For example, the Finish Time may be calculated for each of the charging stations associated with the first reservation selection input 904, the second reservation selection input 906, and the third reservation selection input 908.

At block 808, the method 1200 includes presenting a charging station map user interface 900 that pinpoints the current geo-location of the electric vehicle and the at least one charging station. For example, the charging station map user interface 900 may indicate the current location 902 of the EV 102. At block 1008, the method 1200 includes displaying the calculated charging information for the at the at least one charging station on the charging station map user interface 900. For example, as shown the Finish Time and Estimated Cost to Charge the vehicle 102 is displayed for the first reservation selection input 904, the second reservation selection input 906, and the third reservation selection input 908.

Figure 13:
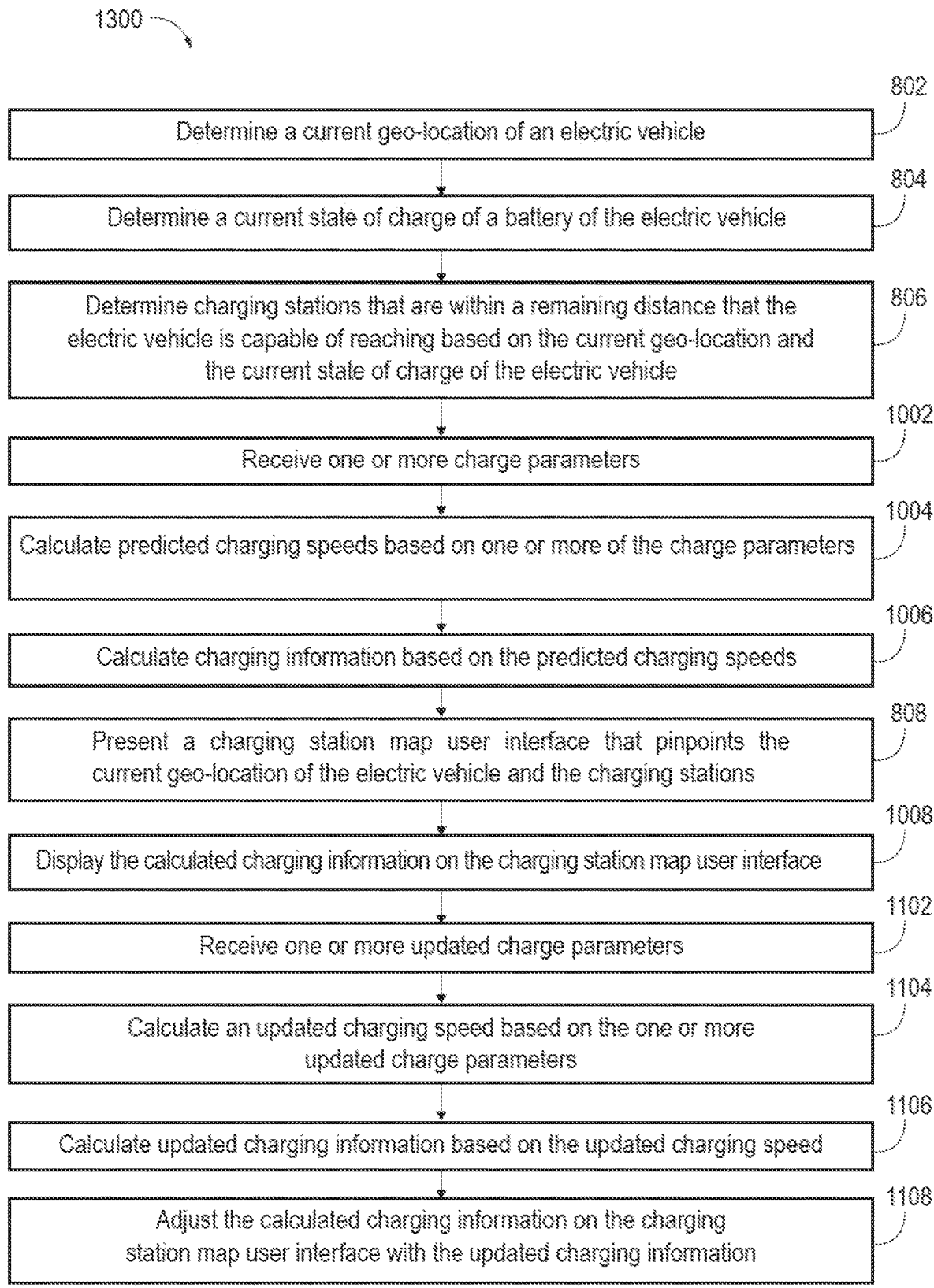
FIG. 13 is a process flow diagram of a method for presenting the charging station map user interface with adjusted charging information according to an exemplary embodiment of the present disclosure.

FIG. 13 is a process flow diagram of a method for presenting the charging station map user interface with adjusted charging information according to an exemplary embodiment of the present disclosure. The method may be iterative such that the charging station map user interface 900 is dynamic and is updated as the charging parameters are updated. Accordingly, in addition to the blocks described above with respect to FIG. 12, FIG. 13 includes block 1102-1108, previously described with respect to FIG. 11. In this manner, the process of predicting charging speeds and corresponding charging information may be iteratively calculated.

It should be apparent from the foregoing description that various exemplary embodiments of the disclosure may be implemented in hardware. Furthermore, various exemplary embodiments may be implemented as instructions stored on a non-transitory machine-readable storage medium, such as a volatile or non-volatile memory, which may be read and executed by at least one processor to perform the operations described in detail herein.

A machine-readable storage medium may include any mechanism for storing information in a form readable by a machine, such as a personal or laptop computer, a server, or other computing device. Thus, a non-transitory machine-readable storage medium excludes transitory signals but may include both volatile and non-volatile memories, including but not limited to read-only memory (ROM), random-access memory (RAM), magnetic disk storage media, optical storage media, flash-memory devices, and similar storage media.

It should be appreciated by those skilled in the art that any block diagrams herein represent conceptual views of illustrative circuitry embodying the principles of the disclosure. Similarly, it will be appreciated that any flow charts, flow diagrams, state transition diagrams, pseudo code, and the like represent various processes which may be substantially represented in machine readable media and so executed by a computer or processor, whether or not such computer or processor is explicitly shown.

It will be appreciated that various implementations of the above-disclosed and other features and functions, or alternatives or varieties thereof, may be desirably combined into many other different systems or applications. Also that various presently unforeseen or unanticipated alternatives, modifications, variations or improvements therein may be subsequently made by those skilled in the art which are also intended to be encompassed by the following claims.

The invention claimed is:

1. A computer-implemented method for presenting electric vehicle charging options, comprising:
determining, by a vehicle computing device of an electric vehicle, a current geo-location of the electric vehicle by communicating with a telematics unit of the electric vehicle via a vehicle communication interface to obtain global positioning system (GPS) location information;
determining, by the vehicle computing device of the electric vehicle, a current state of charge of a battery of the electric vehicle by communicating with a vehicle electronic control unit of the electric vehicle via the vehicle communication interface;
identifying, by the vehicle computing device of the electric vehicle, a plurality of charging stations, for providing the battery a charge via a charging link with the electric vehicle, that are within a remaining distance that the electric vehicle is capable of traveling based on the current geo-location of the electric vehicle and the current state of charge of the battery of the electric vehicle;
receiving, by the vehicle computing device of the electric vehicle, one or more charge parameters from the plurality of charging stations that indicate a status of the plurality of charging stations based on real-time data from charging stations of the plurality of charging stations;
calculating, by the vehicle computing device of the electric vehicle, predicted charging speeds for the plurality of charging stations based on the one or more of the charge parameters from the plurality of charging stations;
calculating, by the vehicle computing device of the electric vehicle, charging information based on the predicted charging speeds for the plurality of charging stations;
presenting, by the vehicle computing device of the electric vehicle, a charging station map user interface on a display associated with the vehicle computing device that pin points the current geo-location of the electric vehicle and the charging stations of the plurality of charging stations, wherein one or more of the charging stations are presented with labels;
displaying, by the vehicle computing device of the electric vehicle, the calculated charging information on the charging station map user interface; and
controlling, by the vehicle computing device, the electric vehicle to replenish the battery with charging power from a selected charging station selected from the charging station map user interface via the charging link by initiating charging based at least in part on when a charging price for the charging power is less than or equal to an operator selected price threshold and terminating charging when the vehicle computing device determines a change in the charging price to a value that is greater than the operator selected price threshold,
wherein the vehicle computing device is selected from the group consisting of
the vehicle electronic control unit,
a vehicle computer in communication with the vehicle telematics unit via the vehicle communication interface,
the vehicle computer in communication with the electronic control unit via the vehicle communication interface, and
the vehicle computer in communication with the vehicle telematics unit and the electronic control unit via the vehicle communication interface.

2. The computer-implemented method of claim 1, wherein calculating the predicted charging speed includes:
generating a prediction model;
extracting charge values from the one or more charge parameters, and
weighting the extracted charge values, wherein the calculating the predicted charging speed is based on the weighted extracted charge values.

3. The computer-implemented method of claim 2, wherein the one or more charge parameters form a set and the charge values are a subset of data extracted from the set of the one or more charge parameters.

4. The computer-implemented method of claim 2, wherein the charging values are extracted from the one or more charging parameters based on a functional threshold that defines a value that affects charging speed.

5. The computer-implemented method of claim 2, wherein the prediction model includes a speed function having weighting coefficients to be multiplied by the charging values extracted from the one or more charging parameters.

6. The computer-implemented method of claim 1, wherein calculating the charging information includes:
comparing the charging information to updated charging information;
determining a difference between the charging information and the updated charging information;
comparing the difference to an update threshold; and
updating the charging information based on the comparison to the update threshold.

7. The computer-implemented method of claim 1, wherein a label of the labels is presented with charging stations based on a category that satisfy conditions associated of the label, and wherein the category is based on the predicted charging speeds.

8. A system for presenting electric vehicle charging options, comprising:
a memory storing instructions when executed by a processor of a vehicle computing device cause the processor to:
determining a current geo-location of the electric vehicle by communicating with a telematics unit of the electric vehicle via a vehicle communication interface to obtain global positioning system (GPS) location information;
determining a current state of charge of a battery of the electric vehicle by communicating with a vehicle electronic control unit of the electric vehicle via the vehicle communication interface;
identifying a plurality of charging stations, for providing the battery a charge via a charging link with the electric vehicle, that are within a remaining distance that the electric vehicle is capable of traveling based on the current geo-location of the electric vehicle and the current state of charge of the battery of the electric vehicle;
receiving one or more charge parameters from the plurality of charging stations that indicate a status of the plurality of charging stations based on real-time data from charging stations of the plurality of charging stations;
calculating predicted charging speeds for the plurality of charging stations based on the one or more of the charge parameters from the plurality of charging stations;
calculating charging information based on the predicted charging speeds for the plurality of charging stations;
presenting a charging station map user interface on a display associated with the vehicle computing device, that pin points the current geo-location of the electric vehicle and the charging stations of the plurality of charging stations, wherein one or more of the charging stations are presented with labels;
displaying the calculated charging information on the charging station map user interface; and
controlling, by the vehicle computing device, the electric vehicle to replenish the battery with charging power from a selected charging station selected from the charging station map user interface via the charging link by initiating charging based at least in part on when a charging price for the charging power is less than or equal to an operator selected price threshold and terminating charging when the vehicle computing device determines a change in the charging price to a value that is greater than the operator selected price threshold,
wherein the vehicle computing device is selected from the group consisting of
the vehicle electronic control unit,
a vehicle computer in communication with the vehicle telematics unit via the vehicle communication interface,
the vehicle computer in communication with the electronic control unit via the vehicle communication interface, and
the vehicle computer in communication with the vehicle telematics unit and the electronic control unit via the vehicle communication interface.

9. The system of claim 8, wherein calculating the predicted charging speed includes:
generating a prediction model;
extracting charge values from the one or more charge parameters, and
weighting the extracted charge values, wherein the calculating the predicted charging speed is based on the weighted extracted charge values.

10. The system of claim 9, wherein the one or more charge parameters form a set and the charge values are a subset of data extracted from the set of the one or more charge parameters.

11. The system of claim 9, wherein the charging values are extracted from the one or more charging parameters based on a functional threshold that defines a value that affects charging speed.

12. The system of claim 9, wherein calculating the charging information includes:
comparing the charging information to updated charging information;
determining a difference between the charging information and the updated charging information;
comparing the difference to an update threshold; and
updating the charging information based on the comparison to the update threshold.

13. The system of claim 8, wherein a label of the labels is presented with charging stations based on a category that satisfy conditions associated of the label, and wherein the category is based on the predicted charging speeds.

14. The system of claim 8, the memory further storing instructions that when executed by the processor cause the processor to:
receiving updated charge parameters;
calculating an updated charging speed based on one or more of the updated charge parameters;
calculating updated charging information based on the updated charging speed; and
updating the calculated charging information on the charging station map user interface with the updated charging information.

15. A non-transitory computer readable storage medium storing instructions that when executed by a computer, which includes a processor perform a method, the method comprising:
determining, by a vehicle computing device of an electric vehicle, a current geo-location of the electric vehicle by communicating with a telematics unit of the electric vehicle via a vehicle communication interface to obtain global positioning system (GPS) location information;
determining, by the vehicle computing device of the electric vehicle, a current state of charge of a battery of the electric vehicle by communicating with a vehicle electronic control unit of the vehicle via the vehicle communication interface;

identifying, by the vehicle computing device of the electric vehicle, a plurality of charging stations, for providing the battery a charge via a charging link with the electric vehicle, that are within a remaining distance that the electric vehicle is capable of traveling based on the current geo-location of the electric vehicle and the current state of charge of the battery of the electric vehicle;

receiving, by the vehicle computing device of the electric vehicle, one or more charge parameters from the plurality of charging stations that indicate a status of the plurality of charging stations based on real-time data from charging stations of the plurality of charging stations;

calculating, by the vehicle computing device of the electric vehicle, predicted charging speeds for the plurality of charging stations based on the one or more of the charge parameters;

calculating, by the vehicle computing device of the electric vehicle, charging information based on the predicted charging speeds for the plurality of charging stations from the plurality of charging stations;

presenting, by the vehicle computing device of the electric vehicle, a charging station map user interface on a display associated with the vehicle computing device that pin points the current geo-location of the electric vehicle and the charging stations of the plurality of charging stations, wherein one or more of the charging stations are presented with labels;

displaying, on a display of the electric vehicle by the vehicle computing device, the calculated charging information on the charging station map user interface; and controlling, by the vehicle computing device, the electric vehicle to replenish the battery with charging power from a selected charging station selected from the charging station map user interface via the charging link by initiating charging based at least in part on when a charging price for the charging power is less than or equal to an operator selected price threshold and terminating charging when the vehicle computing device determines a change in the charging price to a value that is greater than the operator selected price threshold, wherein the vehicle computing device is selected from the group consisting of
the vehicle electronic control unit,
a vehicle computer in communication with the vehicle telematics unit via the vehicle communication interface,
the vehicle computer in communication with the electronic control unit via the vehicle communication interface, and
the vehicle computer in communication with the vehicle telematics unit and the electronic control unit via the vehicle communication interface.

16. The non-transitory computer readable storage medium of claim 15, wherein calculating the predicted charging speed includes:
generating a prediction model;
extracting charge values from the one or more charge parameters, and
weighting the extracted charge values, wherein the calculating the predicted charging speed is based on the weighted extracted charge values.

17. The non-transitory computer readable storage medium of claim 16, wherein the one or more charge parameters form a set and the charge values are a subset of data extracted from the set of the one or more charge parameters.

18. The non-transitory computer readable storage medium of claim 16, wherein the prediction model includes a speed function having weighting coefficients to be multiplied by the charging values extracted from the one or more charging parameters.

19. The non-transitory computer readable storage medium of claim 15, wherein calculating the charging information includes:
comparing the charging information to updated charging information;
determining a difference between the charging information and the updated charging information;
comparing the difference to an update threshold; and
updating the charging information based on the comparison to the update threshold.

20. The non-transitory computer readable storage medium of claim 15, further comprising:
receiving updated charge parameters;
calculating an updated charging speed based on one or more of the updated charge parameters;
calculating updated charging information based on the updated charging speed; and
updating the calculated charging information on the charging station map user interface with the updated charging information.

* * * * *